United States Patent
Wu et al.

(10) Patent No.: US 9,455,025 B2
(45) Date of Patent: Sep. 27, 2016

(54) STATIC RANDOM ACCESS MEMORY AND METHOD OF CONTROLLING THE SAME

(71) Applicant: TAIWAN SEMICONDUCTOR MANUFACTURING COMPANY, LTD., Hsinchu (TW)

(72) Inventors: Ching-Wei Wu, Caotun Town (TW); Ming-Hung Chang, Tainan (TW); Chia-Cheng Chen, Toufen Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/317,076

(22) Filed: Jun. 27, 2014

(65) Prior Publication Data

US 2015/0380077 A1 Dec. 31, 2015

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
CPC .... G11C 11/412; G11C 11/413; G11C 11/41
USPC ........................................ 365/154, 156, 203
See application file for complete search history.

(56) References Cited

U.S. PATENT DOCUMENTS

2010/0329069 A1\* 12/2010 Ito et al. ................... 365/230.06
2013/0128680 A1\* 5/2013 Holla et al. .................... 365/206
2015/0364184 A1\* 12/2015 Park ...................... G11C 11/419
365/156

\* cited by examiner

*Primary Examiner* — Huan Hoang
(74) *Attorney, Agent, or Firm* — Hauptman Ham, LLP

(57) ABSTRACT

A static random access memory (SRAM) including at least a memory cell array, a first data line connected to the memory cell array, and a read assist unit connected to the first data line. The read assist unit is configured to suppress a voltage level of the first data line during a read operation of the memory cell array.

20 Claims, 10 Drawing Sheets

STATIC RANDOM ACCESS MEMORY AND METHOD OF CONTROLLING THE SAME

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. As ICs have become smaller and more complex, operating voltages continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
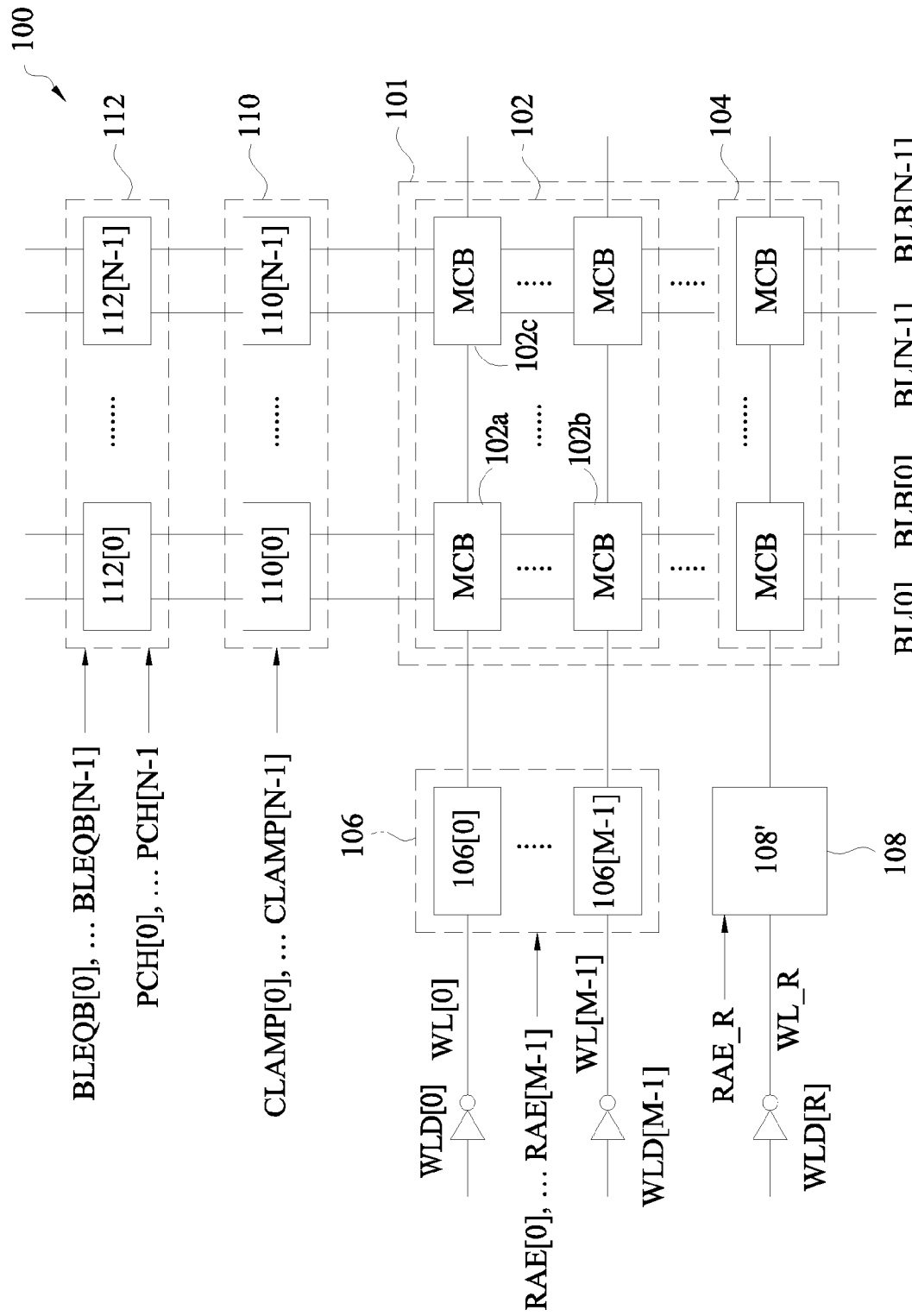
FIG. 1 is a block diagram of a representative portion of a memory circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram of a representative portion of a memory circuit 100 in accordance with one or more embodiments. Memory circuit 100 includes memory cell array 101, first read assist circuit 106, second read assist circuit 108, clamping circuit 110 and bit line circuit 112.

Memory circuit 100 also includes word lines WL[0], . . . WL[M−1], WL_R, bit lines BL[0], . . . BL[N−1] and bit line bars BLB[0], . . . BLB [N−1], where M is an integer corresponding to the number of rows, and N is an integer corresponding to the number of columns in memory cell array 102. Note that the term "bar" as used in this context indicates a logically inverted signal, for example, bit line bar BLB[0], . . . BLB [N−1] carries a signal logically inverted from a signal carried by bit line BL[0], . . . BL[N−1].

Memory cell array 101 includes a first memory cell array 102 and a second memory cell array 104. First memory cell array 102 is electrically connected to first read assist circuit 106 by word lines WL[0], . . . WL[M−1]. First memory cell array 102 is electrically connected to clamping circuit 110 and bit line circuit 112 by bit lines BL[0], . . . BL[N−1] and bit line bars BLB[0], . . . BLB[N−1].

First memory cell array 102 includes an array of memory cells MCB including M rows by N columns, where M is an integer corresponding to the number of rows and N is an integer corresponding to the number of columns. In some embodiments, M is an integer ranging from 1 to 256. In some embodiments, N is an integer ranging from 1 to 144. In some embodiments, first memory cell array 102 includes one or more single port (SP) static random access memory (SRAM) cells MCB.

M word lines WL[0], . . . WL[M−1]) carry signals to activate corresponding rows in the first memory cell array 102, where M is an integer corresponding to the number of rows in first memory cell array 102. Word line WL[0] is electrically connected to each of the memory cells MCB that form row 0 of the first memory cell array 102. Word line WL[M−1] is electrically connected to each of the memory cells MCB that form row M−1 of the first memory cell array 102. Each of the word lines WL[0], . . . WL[M−1] is electrically connected to a first read assist circuit 106. Each of the word lines WL[0], . . . WL[M−1] is electrically connected to a corresponding word line driver (e.g., WLD [0], . . . WLD[M−1]).

Word line WL_R carries signals to activate a corresponding row in the second memory cell array 104. Word line WL_R is electrically connected to each of the memory cells MCB that form the second memory cell array 104. Word line WL_R is electrically connected to a second read assist circuit 108. The word line WL_R is electrically connected to a corresponding word line driver (e.g., WLD[R]).

N bit lines BL[0], . . . BL[N−1]) carry data signals in selected memory cells in a column in the first memory cell array 102 or the second memory cell array 104, where N is an integer corresponding to the number of columns in the first memory cell array 102. Bit line BL[0] is electrically connected to each of the memory cells MCB that form column 0 of the first memory cell array 102 or the second memory cell array 104. Bit line BL[N−1] is electrically connected to each of the memory cells MCB that form column N−1 of the first memory cell array 102 or the second memory cell array 104. Each of the bit lines BL[0], . . . BL[N−1] is electrically connected to a clamping circuit 110 and a bit line circuit 112. Each of the bit lines BL[0], . . . BL[N−1] is electrically connected to corresponding external circuitry (not shown).

N bit line bars (BLB[0]-BLB[N−1]) carry data signals in selected memory cells in a column in the first memory cell array 102 or the second memory cell array 104. Bit line bar BLB[0] is electrically connected to each of the memory cells MCB that form column 0 of the first memory cell array 102 or the second memory cell array 104. Bit line bar BLB[N−1] is electrically connected to each of the memory cells MCB that form column N−1 of the first memory cell array 102 or the second memory cell array 104. Each of the bit line bars BLB[0], . . . BLB[N−1] is electrically connected to a clamping circuit 110 and a bit line circuit 112. Each of the bit line bars BLB[0], . . . BLB[N−1] is electrically connected to corresponding external circuitry (not shown).

Second memory cell array 104 is electrically connected to second read assist circuit 108 by word line WL_R. Second memory cell array 104 is electrically connected to clamping circuit 110 and bit line circuit 112 by bit lines BL[0], . . . BL[N−1] and bit line bars BLB[0], . . . BLB[N−1]. Second memory cell array 104 includes an array of memory cells MCB including 1 row by N columns, where N is an integer corresponding to the number of columns. In some embodiments, second memory cell array 104 includes one or more SP SRAM cells MCB. In some embodiments, the second memory cell array 104 is a replica of one of the rows of the first memory cell array 102. In some embodiments, the second memory cell array 104 is included as a portion of the first memory cell array 102, and corresponds to one of the rows of the first memory cell array 102. In some embodiments, the second memory cell array 104 is a dummy memory cell array as one or more of the memory cells MCB contained in the second memory cell array 104 corresponds to a dummy memory cell. A dummy memory cell is a memory cell not configured to store data.

First read assist circuit 106 is electrically connected to first memory cell array 102 by word lines WL[0], . . . WL[M−1], where M is an integer corresponding to the number of rows in first memory cell array 102. First read assist circuit 106 is configured to receive a first voltage control signal RAE[0], . . . RAE[M−1], where M is an integer corresponding to the number of rows in first memory cell array 102. First read assist circuit 106 is configured to control a voltage level on each of the word lines WL[0], . . . WL[M−1].

First read assist circuit 106 includes first read assist units 106[0], . . . 106[M−1] where M is an integer corresponding to the number of rows in first memory cell array 102. In some embodiments, each of the first read assist units 106[0], . . . 106[M−1] are configured to perform an equivalent function. Each of the first read assist units 106[0], . . . 106[M−1] is electrically connected to a row of memory cells MCB in the first memory cell array 102 by a corresponding word line WL[0], . . . WL[M−1]. Each of the first read assist units 106[0], . . . 106[M−1] is configured to control a voltage level on a corresponding word line WL[0], . . . WL[M−1] for various operations of memory circuit 100. In some embodiments, each of the first read assist units 106[0], . . . 106[M−1] is configured to pull a voltage level on a corresponding word line WL[0], . . . WL[M−1] toward a first intermediate voltage level during a read operation of memory circuit 100. In some embodiments, each of the first read assist units 106[0], . . . 106[M−1] is configured to adjust a voltage level on a corresponding word line WL[0], . . . WL[M−1] toward a first intermediate voltage level during a read operation of memory circuit 100. In some embodiments, the first intermediate voltage level is less than a voltage source VDD. In some embodiments, the first intermediate voltage level is greater than a ground voltage VSS. In some embodiments, the first intermediate voltage level is less than the voltage source VDD by a resistance ratio of the first read assistance unit 200. In some embodiments, the resistance ratio of the first read assistance unit 200 is equal to a ratio of one or more word line drivers (e.g., WLD[0], . . . WLD[M−1]) and the NMOS transistors N1[0], . . . N1[Y−1] (shown in FIGS. 2A-2B) within the first read assistance unit 200. In some embodiments, the first intermediate voltage level is a suppressed word line voltage level.

For a read operation of a specific memory cell MCB in the first memory cell array 102, the first read assist unit 106[0], . . . 106[M−1] connected to the specific memory cell MCB in the first memory cell array 102 is activated, and the remaining first read assist units 106[0], . . . 106[M−1] are not activated. For a write operation, each of the first read assist units 106[0], . . . 106[M−1] is not activated. For example, for a read operation of memory cell 102a in the first memory cell array 102 (where M is equal to 2), the first read assist circuit 106 includes 2 first read assist units 106[0] and 106[1] which are connected to word lines WL[0] and WL[1]. In this example, the first read assist unit 106[0] is connected to memory cell 102a by word line WL[0] and the first read assist unit 106[1] is connected to memory cell 102b by word line WL[1]. In this example, for a read operation of memory cell 102a, the first read assist unit 106[0] is activated and the remaining first read assist units (e.g., first read assist unit 106[1]) are not activated.

In some embodiments, the first voltage control signal RAE[0], . . . RAE[M−1] activates the corresponding first read assist unit 106[0], . . . 106[M−1] if the first voltage control signal RAE transitions from a logically low signal to a logically high signal. In some embodiments, the first voltage control signal RAE[0], . . . RAE[M−1] deactivates the corresponding first read assist unit 106[0], . . . 106[M−1] if the first voltage control signal RAE transitions from a logically high signal to a logically low signal.

Second read assist circuit 108 is electrically connected to a row of memory cells MCB in the second memory cell array 104 by a corresponding word line WL_R. Second read assist circuit 108 is configured to receive a second voltage control signal RAE_R. The second read assist circuit 108 is configured to control a voltage level on a corresponding word line WL_R for various operations of memory circuit 100. In some embodiments, second read assist circuit 108 is configured to pull a voltage level on a corresponding word line WL_R toward a first intermediate voltage level for a dummy read operation. A dummy read operation is an operation which emulates a read operation. In some embodiments, a dummy read operation is performed in memory circuit 100 in order to not affect one or more functions which are triggered from the read operation. In some embodiments, second read assist circuit 108 is configured to adjust a voltage level on a corresponding word line WL_R toward a first intermediate voltage level for a dummy read operation. In some embodiments, the second read assist circuit 108 is configured to perform the same function as one of the first read assist units 106[0], . . . 106[M−1]. In some embodiments, the second read assist circuit 108 corresponds to a replica of one of the first read assist units 106[0], . . . 106[M−1]. In some embodiments, the second read assist circuit 108 is configured to emulate one of the first read assist units 106[0], . . . 106[M−1] for a dummy read operation. Second read assist circuit 108 also corresponds to a second read assist unit 108'.

For a dummy read operation of the second memory cell array 104, the second read assist unit 108' is activated, and each of the first read assist units 106[0], . . . 106[M−1] are deactivated. For a write operation, the second read assist unit 108' and each of the first read assist units 106[0], . . . 106[M−1] are not activated.

In some embodiments, the second voltage control signal RAE_R activates the corresponding second read assist unit 108' if the second voltage control signal RAE_R transitions from a logically low signal to a logically high signal. In some embodiments, the second voltage control signal RAE_R deactivates the corresponding second read assist unit 108' if the second voltage control signal RAE_R transitions from a logically high signal to a logically low signal.

Clamping circuit 110 is electrically connected to first memory cell array 102 or second memory cell array 104 by bit lines BL[0], . . . BL[N−1] and bit line bars BLB[0], . . . BL[N−1], where N is an integer corresponding to the number of columns in the first memory cell array 102 or second memory cell array 104. Clamping circuit 110 is electrically connected to bit line circuit 112 by bit lines BL[0], . . . BL[N−1] and bit line bars BLB[0], . . . BL[N−1], where N is an integer corresponding to the number of columns in the first memory cell array 102. Clamping circuit 110 is configured to receive a first clamping control signal CLAMP. Clamping circuit 110 is configured to control a voltage level on each of the bit lines BL[0], . . . BL[N−1] and bit line bars BLB[0], . . . BL[N−1].

Clamping circuit 110 includes clamping units 110[0], . . . 110[N−1] where N is an integer corresponding to the number of columns in the first memory cell array 102. In some embodiments, each of the clamping units 110[0], . . . 110[N−1] are configured to perform an equivalent function. Each of the clamping units 110[0], . . . 110[N−1] is electrically connected to a column of memory cells MCB in the first memory cell array 102 or second memory cell array 104 by a corresponding bit line BL[0], . . . BL[N−1] and a corresponding bit line bar BLB[0], . . . BL[N−1]. Each of the clamping units 110[0], . . . 110[N−1] is electrically connected to bit line circuit 112 by a corresponding bit line BL[0], . . . BL[N−1] and a corresponding bit line bar BLB[0], . . . BL[N−1]. Each of the clamping units 110[0], . . . 110[N−1] is configured to control a voltage level on a corresponding bit line BL[0], . . . BL[N−1] and a corresponding bit line bar BLB[0], . . . BL[N−1] for various operations of memory circuit 100. In some embodiments, each of the clamping units 110[0], . . . 110[N−1] is configured to pull a voltage level on a corresponding bit line BL[0], . . . BL[N−1] and a corresponding bit line bar BLB[0], . . . BL[N−1] toward a second intermediate voltage level prior to a write operation of memory circuit 100. In some embodiments, each of the clamping units 110[0], . . . 110[N−1] is configured to pull a voltage level on a corresponding bit line BL[0], . . . BL[N−1] and a corresponding bit line bar BLB[0], . . . BL[N−1] toward a second intermediate voltage level after a read operation of memory circuit 100. In some embodiments, each of the clamping units 110[0], . . . 110[N−1] is configured to adjust a voltage level on a corresponding bit line BL[0], . . . BL[N−1] and a corresponding bit line bar BLB[0], . . . BL[N−1] toward a second intermediate voltage level prior to a write operation of memory circuit 100. In some embodiments, each of the clamping units 110[0], . . . 110[N−1] is configured to adjust a voltage level on a corresponding bit line BL[0], . . . BL[N−1] and a corresponding bit line bar BLB[0], . . . BL[N−1] toward a second intermediate voltage level after a read operation of memory circuit 100.

In some embodiments, the second intermediate voltage level is less than a voltage source VDD. In some embodiments, the second intermediate voltage level is greater than a ground voltage VSS. In some embodiments, the first intermediate voltage level is substantially equal to the second intermediate voltage level. In some embodiments, the first intermediate voltage level is greater than the second intermediate voltage level.

For a write operation of a specific memory cell MCB in the first memory cell array 102, each of the clamping units 110[0], . . . 110[N−1] are activated. For example, for a write operation of memory cell 102a in the first memory cell array 102 (where N is equal to 2), the clamping circuit 110 includes 2 clamping units 110[0] and 110[1], which are connected to bit lines BL[0] and BL[1] and bit line bars BLB[0] and BLB[1]. In this example, the clamping unit 110[0] is connected to memory cell 102a by bit line BL[0] and bit line bar BLB[0], and the clamping unit 110[1] is connected to memory cell 102c by bit line BL[1] and bit line bar BLB[1]. In this example, for a write operation of memory cell 102a, the clamping units 110[0] and 110[1] are activated.

In some embodiments, the first clamping control signal CLAMP activates the clamping units 110[0], . . . 110[N−1], if the first clamping control signal CLAMP transitions from a logically low signal to a logically high signal. In some embodiments, the first clamping control signal CLAMP deactivates the clamping units 110[0], . . . 110[N−1], if the first clamping control signal CLAMP transitions from a logically high signal to a logically low signal.

Bit line circuit 112 is electrically connected to first memory cell array 102 or second memory cell array 104 by bit lines BL[0], . . . BL[N−1] and bit line bars BLB[0], . . . BL[N−1], where N is an integer corresponding to the number of columns in the first memory cell array 102 or second memory cell array 104. Bit line circuit 112 is electrically connected to clamping circuit 110 by bit lines BL[0], . . . BL[N−1] and bit line bars BLB[0], . . . BL[N−1], where N is an integer corresponding to the number of columns in the first memory cell array 102 or second memory cell array 104. Bit line circuit 112 is configured to receive a first bit line control signal PCH and a second bit line control signal BLEQB. Bit line circuit 112 is configured to control a voltage level on each of the bit lines BL[0], . . . BL[N−1] and bit line bars BLB[0], . . . BL[N−1].

Bit line circuit 112 includes bit line control units 112[0], . . . 112[N−1] where N is an integer corresponding to the number of columns in the first memory cell array 102 or second memory cell array 104. In some embodiments, each of the bit line control units 112[0], . . . 112[N−1] are configured to perform an equivalent function. Each of the bit line control units 112[0], . . . 112[N−1] is electrically connected to a column of memory cells MCB in the first memory cell array 102 or second memory cell array 104 by a corresponding bit line BL[0], . . . BL[N−1] and a corresponding bit line bar BLB[0], . . . BL[N−1]. Each of the bit line control units 112[0], . . . 112[N−1] is electrically connected to clamping circuit 110 by a corresponding bit line BL[0], . . . BL[N−1] and a corresponding bit line bar BLB[0], . . . BL[N−1]. Each of the bit line control units 112[0], . . . 112[N−1] is configured to control a voltage level on a corresponding bit line BL[0], . . . BL[N−1] and a corresponding bit line bar BLB[0], . . . BL[N−1] for various operations of memory circuit 100. In some embodiments, each of the bit line control units 112[0], . . . 112[N−1] is configured to pull a voltage level on a corresponding bit line BL[0], . . . BL[N−1] and a corresponding bit line bar BLB[0], . . . BL[N−1] toward a third intermediate voltage level prior to a write operation of memory circuit 100. In some embodiments, each of the bit line control units 112[0], . . . 112[N−1] is configured to pull a voltage level on a corresponding bit line BL[0], . . . BL[N−1] and a corresponding bit line bar BLB[0], . . . BL[N−1] toward a third intermediate voltage level after a read operation of memory circuit 100. In some embodiments, each of the bit line control units 112[0], . . . 112[N−1] is configured to adjust a voltage level on a corresponding bit line BL[0], . . . BL[N−1] and a corresponding bit line bar BLB[0], . . . BL[N−1] toward a third intermediate voltage level prior to a write operation of memory circuit 100. In some embodiments, each of the bit line control units 112[0], . . . 112[N−1] is configured to adjust a voltage level on a corresponding bit line BL[0], . . . BL[N−1] and a corresponding bit line bar BLB[0], . . . BL[N−1] toward a third intermediate voltage level after a read operation of memory circuit 100.

In some embodiments, the third intermediate voltage level is less than a voltage source VDD. In some embodiments, the third intermediate voltage level is greater than a ground voltage VSS. In some embodiments, the first intermediate voltage level is substantially equal to the third intermediate voltage level. In some embodiments, the second intermediate voltage level is substantially equal to the third intermediate voltage level. In some embodiments, the first intermediate voltage level is greater than the third intermediate voltage level.

For a write operation of a specific memory cell MCB in the first memory cell array 102, each of the bit line control units 112[0], . . . 112[N−1] are activated. For example, for a write operation of memory cell 102a in the first memory cell array 102 (where N is equal to 2), the bit line circuit 112 includes 2 bit line control units 112[0] and 112[1], which are connected to bit lines BL[0] and BL[1] and bit line bars BLB[0] and BLB[1]. In this example, the bit line control unit 112[0] is connected to memory cell 102a by bit line BL[0] and bit line bar BLB[0], and the bit line control unit 112[1] is connected to memory cell 102c by bit line BL[1] and bit line bar BLB[1]. In this example, for a write operation of memory cell 102a, the bit line control units 112[0] and 112[1] are activated.

In some embodiments, the first bit line control signal PCH or the second bit line control signal BLEQB activate the bit line control units 112[0], . . . 112[N−1], if the first bit line control signal PCH or the second bit line control signal BLEQB transitions from a logically high signal to a logically low signal. In some embodiments, the first bit line control signal PCH and the second bit line control signal BLEQB deactivate the bit line control units 112[0], . . . 112[N−1], if the first bit line control signal PCH and the second bit line control signal BLEQB transition from a logically low signal to a logically high signal.

Figures 2A, 2B:
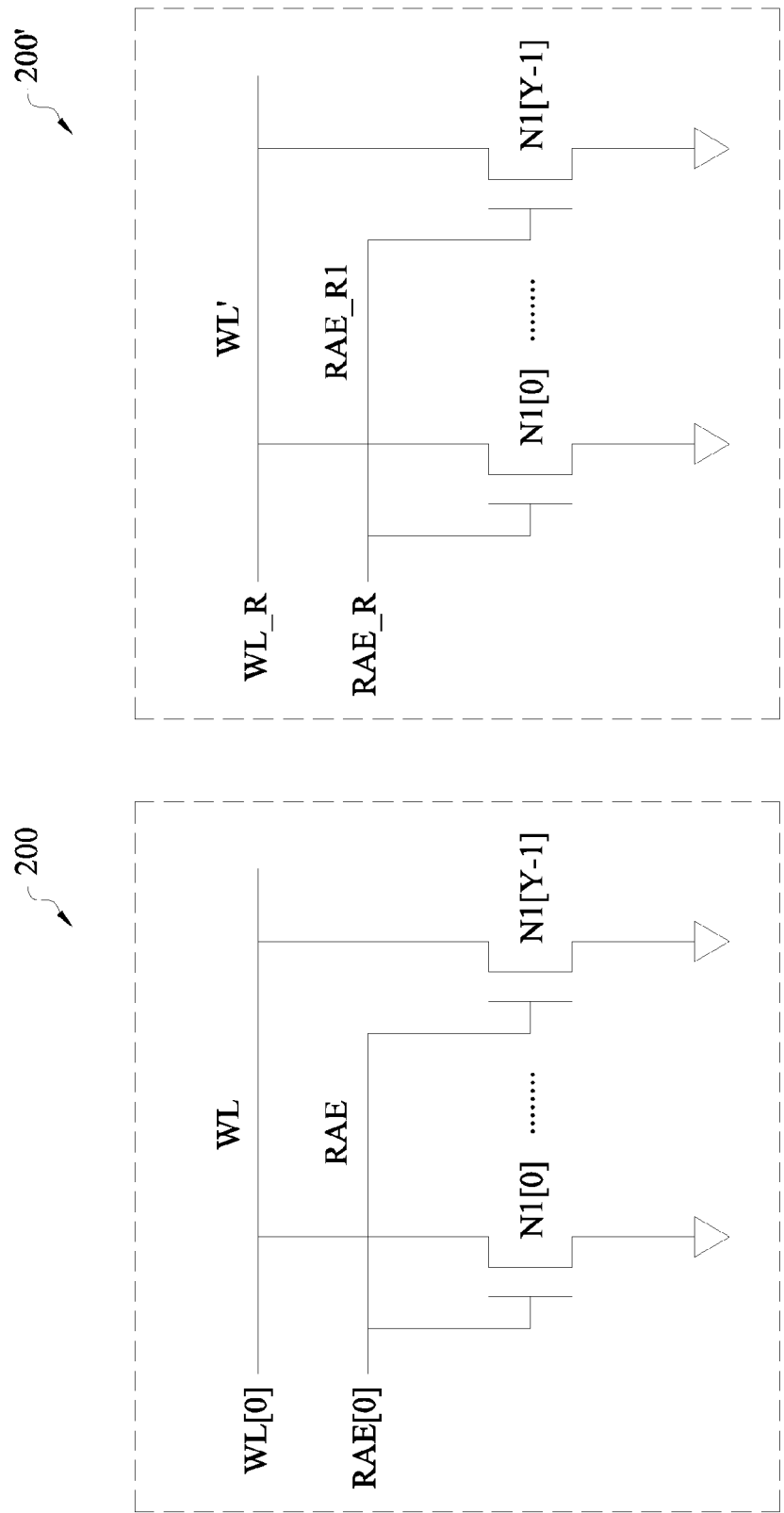
FIG. 2A is schematic diagram of a first read assist unit in accordance with some embodiments.
FIG. 2B is schematic diagram of a second read assist unit in accordance with some embodiments.

FIG. 2A is a schematic diagram of a first read assist unit 200 in accordance with one or more embodiments. First read assist unit 200 is an embodiment of first read assist unit 106[0] shown in FIG. 1. Word line WL[0] is an embodiment of word line WL[0] shown in FIG. 1.

First read assist unit 200 is configured to receive a first voltage control signal RAE on the read assist enable line RAE[0]. First read assist unit 200 is configured to control a first word line signal WL on word line WL[0]. In some embodiments, first read assist unit 200 is configured to selectively adjust the voltage of the first word line signal WL on word line WL[0].

First read assist unit 200 includes n-type metal oxide semiconductor (NMOS) transistors N1[0], . . . N1[Y−1], where Y is an integer corresponding to the number of NMOS transistors in the read assist unit 200. In some embodiments, Y is an integer ranging from 1 to 8. First read assist unit 200 also includes word line WL[0] and read assist enable line RAE[0]. In some embodiments, N1[0], . . . N1[Y−1] is a PMOS transistor or a resistor.

Each NMOS transistor N1[0], . . . N1[Y−1] is connected in a parallel configuration. The gate of each NMOS transistor N1[0], . . . N1[Y−1] is connected to a read assist enable line RAE[0]. The gate of each NMOS transistor N1[0], . . . N1[Y−1] is configured to receive a first voltage control signal RAE. In some embodiments, the first voltage control signal RAE is an enable/disable signal which selectively turns on/off each NMOS transistor N1[0], . . . N1[Y−1]. The first voltage control signal RAE is, e.g., a logically low signal or a logically high signal. The drain of each NMOS transistor N1[0], . . . N1[Y−1] is connected to the word line WL[0]. The drain of each NMOS transistor N1[0], . . . N1[Y−1] is configured to receive a first word line control signal WL. In some embodiments, the first word line control signal WL is, e.g., a logically low signal or a logically high signal. In some embodiments, the first word line control signal WL is substantially equal to a first intermediate voltage level. The source of each NMOS transistor N1[0], . . . N1[Y−1] is connected to a ground terminal VSS.

Figure 4A:
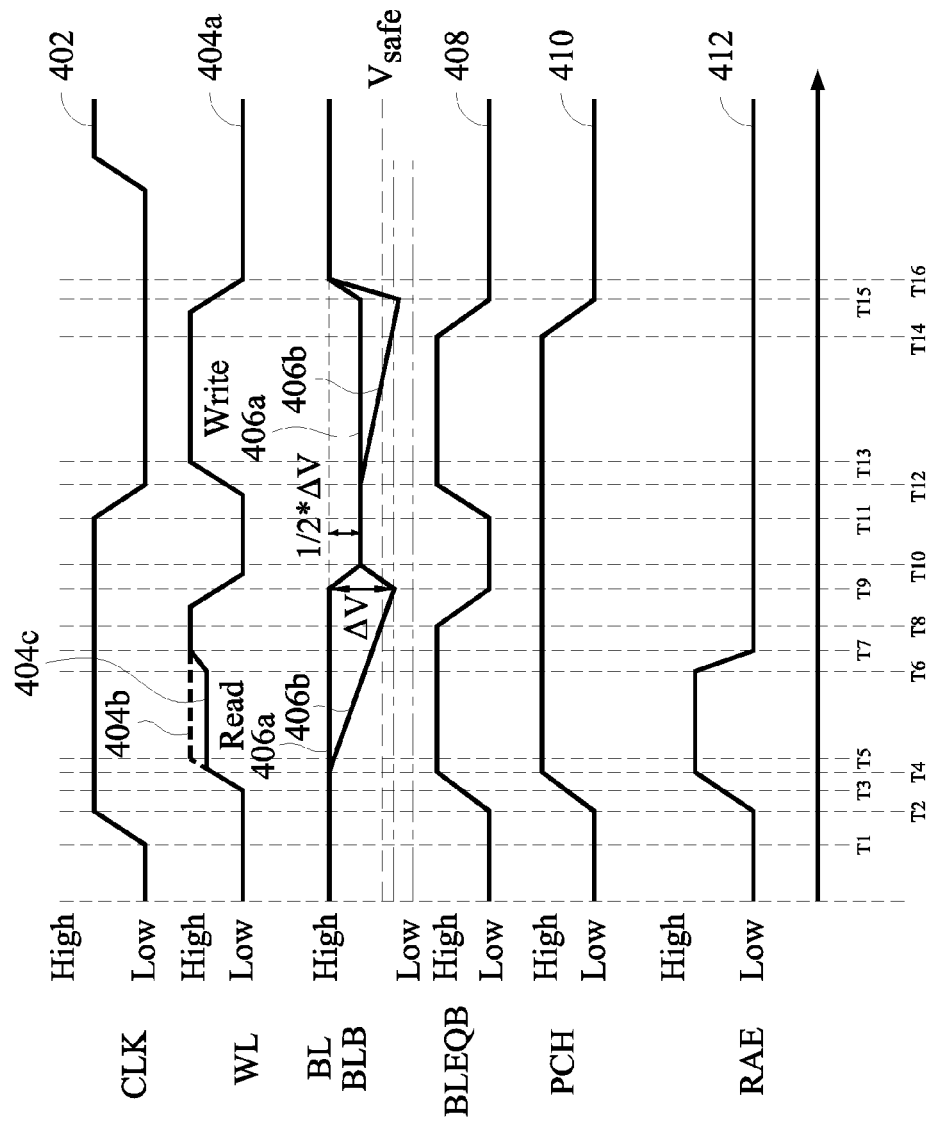
FIG. 4A a waveform diagram of signals applied to a memory circuit in accordance with one or more embodiments.

NMOS transistors N1[0], . . . N1[Y−1] are configured to control the first word line control signal WL. In some embodiments, each of the NMOS transistors N1[0], . . . N1[Y−1] isconfigured to pull a voltage level (e.g., WL) on word line WL[0], toward a first intermediate voltage level during a read operation of memory circuit 100. In some embodiments, PMOS transistors are utilized in place of NMOS transistors N1[0], . . . N1[Y−1] in the first read assist unit 200. In some embodiments, the pulse width of a suppressed word line signal (e.g., curve 404c as shown in FIG. 4A) is controlled by the pulse width of the first voltage control signal RAE. In some embodiments, the first voltage control signal RAE activates the corresponding first read assist unit 200, if the first voltage control signal RAE transitions from a logically low signal to a logically high signal. In some embodiments, the first voltage control signal RAE deactivates the corresponding first read assist unit 200, if the first voltage control signal RAE transitions from a logically high signal to a logically low signal.

In some embodiments, one or more of NMOS transistors N1[0], . . . N1[Y−1] includes three-dimensional gate structures, e.g. fin field-effect-transistors (FinFET). In some embodiments, PMOS transistors are utilized in place of NMOS transistors N1[0], . . . N1[Y−1] in the first read assist unit 200.

FIG. 2B is a schematic diagram of a second read assist unit 200' in accordance with one or more embodiments. Second read assist unit 200' is an embodiment of second read assist unit 108' shown in FIG. 1 with similar elements. Second read assist unit 200' is also an embodiment of the first read assist unit 200 shown in FIG. 2A with similar elements. Word line WL_R is an embodiment of word line WL[0] shown in FIG. 1.

In comparison with FIG. 2A, the second read assist unit 200' (of FIG. 2B) includes word line WL_R instead of word line WL[0]. In comparison with FIG. 2A, the drain of each NMOS transistor N1[0], . . . N1[Y−1] (of FIG. 2B) is configured to receive a second word line control signal WL' instead of first word line signal WL. In some embodiments, the second word line control signal WL' is, e.g., a logically low signal or a logically high signal. In some embodiments, the second word line control signal WL' is substantially equal to a first intermediate voltage level.

In comparison with FIG. 2A, the second read assist unit 200' (of FIG. 2B) also includes read assist enable line RAE_R instead of read assist enable line RAE[0]. In comparison with FIG. 2A, the gate of each NMOS transistor N1[0], . . . N1[Y−1] (of FIG. 2B) is configured to receive a second voltage control signal RAE_R1 instead of first voltage control signal RAE. In some embodiments, the second voltage control signal RAE_R1 is an enable/disable signal which selectively turns on/off each NMOS transistor N1[0], . . . N1[Y−1]. The second voltage control signal RAE_R1 is, e.g., a logically low signal or a logically high signal.

Second read assist unit 200' is configured to control a second word line signal WL' on word line WL_R. In some embodiments, second read assist unit 200' is configured to selectively adjust the voltage of the second word line signal WL' on word line WL_R.

Figure 4B:
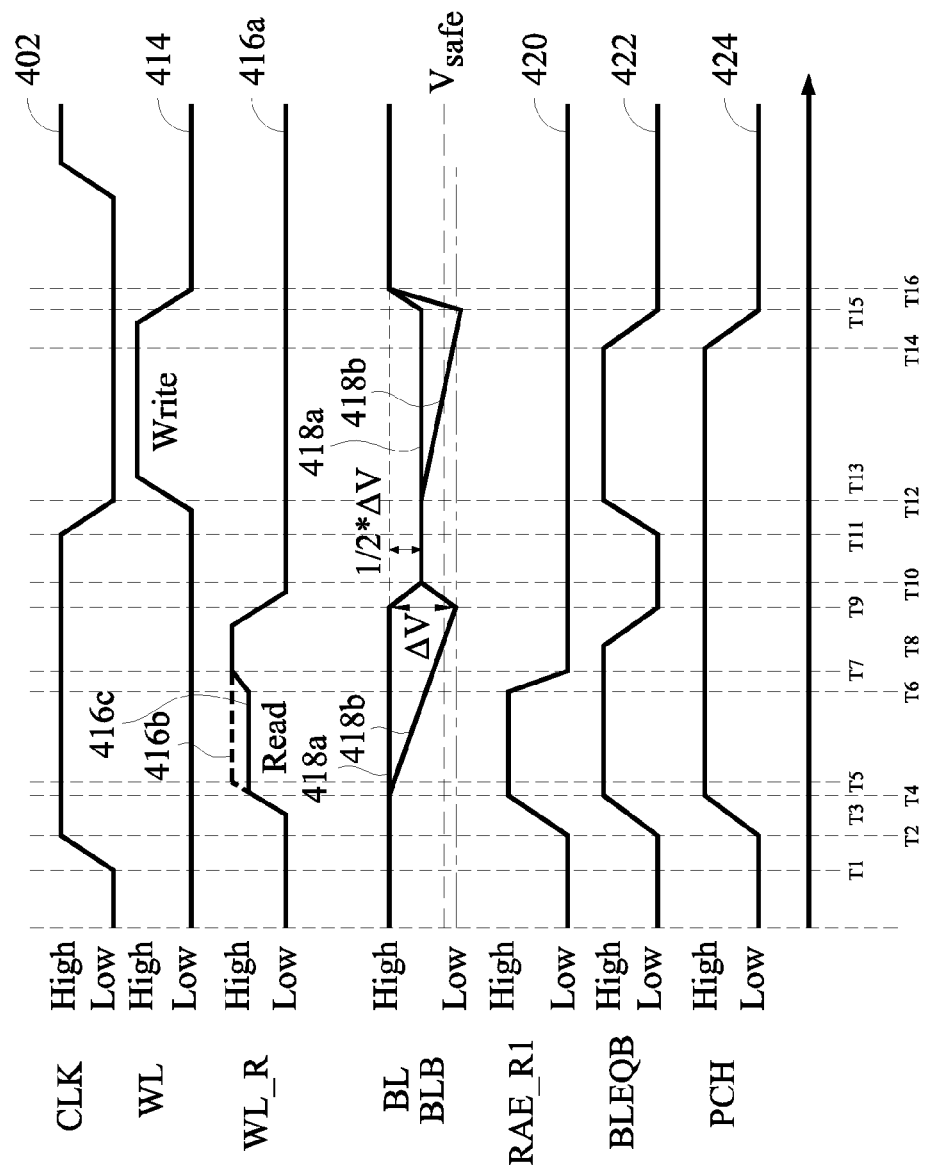
FIG. 4B a waveform diagram of signals applied to a memory circuit in accordance with one or more embodiments.

NMOS transistors N1[0], . . . N1[Y−1] are configured to control the second word line control signal WL'. In some embodiments, each of the NMOS transistors N1[0], . . . N1[Y−1] is configured to pull a voltage level (e.g., second word line signal WL') on word line WL_R, toward a first intermediate voltage level during a dummy read operation of memory circuit 100. In some embodiments, PMOS transistors are utilized in place of NMOS transistors N1[0], . . . N1[Y−1] in the second read assist unit 200'. In some embodiments, the pulse width of a suppressed word line signal (e.g., curve 416c as shown in FIG. 4B) is controlled by the pulse width of the second voltage control signal RAE_R1.

In some embodiments, the second voltage control signal RAE_R1 activates the corresponding second read assist unit 200' if the second voltage control signal RAE_R1 transitions from a logically low signal to a logically high signal. In some embodiments, the second voltage control signal RAE_R1 deactivates the corresponding second read assist unit 200' if the second voltage control signal RAE_R1 transitions from a logically high signal to a logically low signal.

In some embodiments, the second read assist unit 200' and dummy word-line driver (e.g., WLD[R] as shown in FIG. 1) are activated to perform a dummy read operation if the memory circuit 100 (shown in FIG. 1) is utilized in a write only operation. In some embodiments, the second read assist unit 200' is configured to emulate the first read assist unit 200 for a dummy read operation. In some embodiments, the second read assist unit 200' is configured to perform the same function as the first read assist unit 200. In some embodiments, the second read assist unit 200' corresponds to a replica of the first read assist unit 200.

In some embodiments, PMOS transistors are utilized in place of NMOS transistors N1[0], . . . N1[Y−1] in the second read assist unit 200'.

Figure 3:
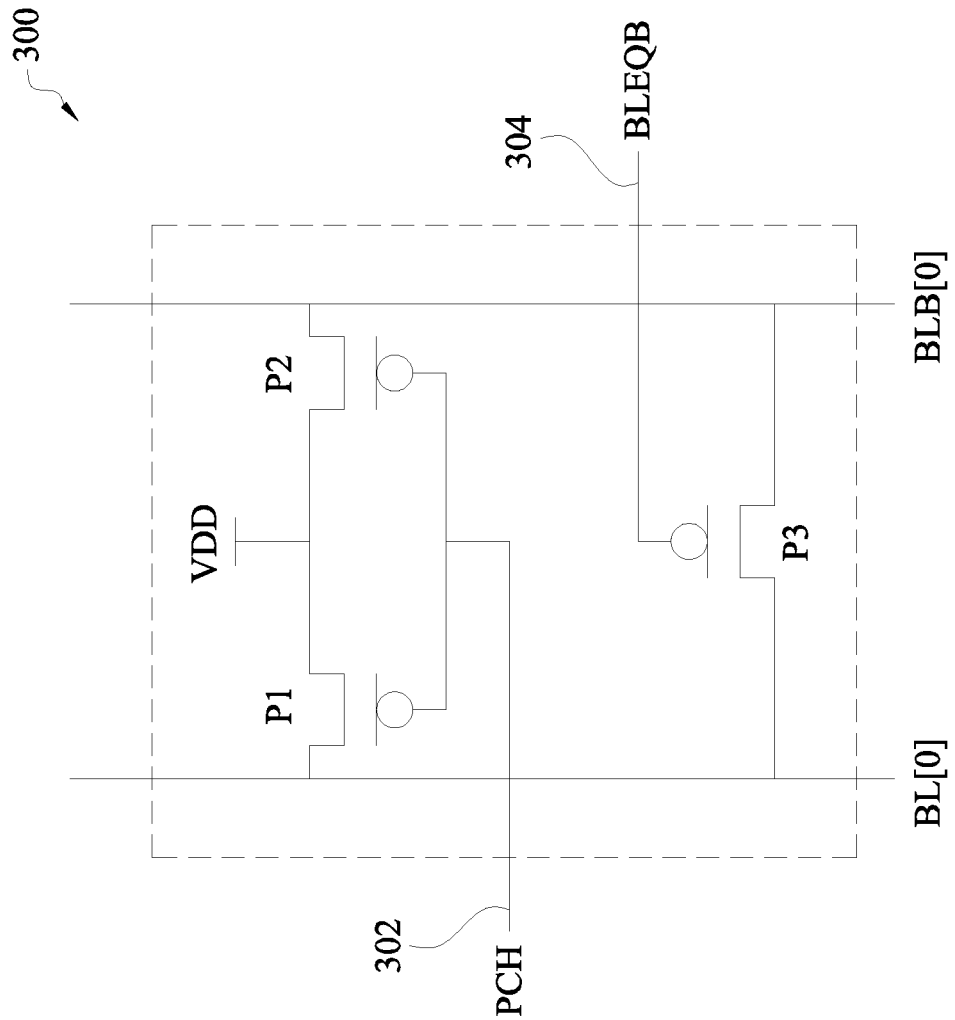
FIG. 3 is a schematic diagram of a bit line control unit in accordance with some embodiments.

FIG. 3 is a schematic diagram of a bit line control unit 300 in accordance with one or more embodiments. Bit line control unit 300 is an embodiment of bit line control unit 112[0] shown in FIG. 1. Bit line BL[0] is an embodiment of bit line BL[0] shown in FIG. 1. Bit line bar BLB[0] is an embodiment of bit line bar BLB[0] shown in FIG. 1.

Bit line control unit 300 is configured to receive a first bit line control signal PCH and a second bit line control signal BLEQB. The first bit line control signal PCH is, e.g., a logically low signal or a logically high signal. The second bit line control signal BLEQB is, e.g., a logically low signal or a logically high signal. Bit line control unit 300 is configured to control a bit line signal BL on the bit line BL[0]. Bit line control unit 300 is configured to control a bit line bar signal BLB on the bit line bar BLB[0]. In some embodiments, bit line control unit 300 is configured to selectively adjust the voltage of the bit line signal BL on the bit line BL[0] or the voltage of the bit line bar signal BLB on the bit line bar BLB[0]. In some embodiments, bit line control unit 300 is configured to equalize the voltage of the bit line signal BL and the voltage of the bit line bar signal BLB to a third intermediate voltage level prior to a write operation.

Bit line control unit 300 includes p-type metal oxide semiconductor (PMOS) transistors P1, P2 and P3, bit line BL[0] and bit line bar BLB[0].

The source of each PMOS transistor P1 and P2 is connected to a voltage source VDD. The drain of PMOS transistor P1 is connected to the bit line BL[0]. The drain of PMOS transistor P2 is connected to the bit line bar BLB[0]. The gates of PMOS transistors P1 and P2 are both connected to a pre-charge line 302. The gate of each PMOS transistor P1 and P2 is configured to receive the first bit line control signal PCH. In some embodiments, the first bit line control signal PCH is an enable/disable signal which selectively turns on/off each PMOS transistor P1 and P2. In some embodiments, for one clock cycle, PMOS transistors P1 and P2 are configured to pre-charge both the bit line BL[0] and the bit line bar BLB[0] to a logically high signal prior to a read operation and a write operation. In some embodiments, for one clock cycle, PMOS transistors P1 and P2 are configured to pre-charge both the bit line BL[0] and the bit line bar BLB[0] to a logically high signal prior to a dummy read operation and a write operation. In some embodiments, for one clock cycle, PMOS transistors P1 and P2 are configured to not pre-charge both the bit line BL[0] and the bit line bar BLB[0] to a logically high signal in between a read operation and a write operation. In some embodiments, for one clock cycle, PMOS transistors P1 and P2 are configured to not pre-charge both the bit line BL[0] and the bit line bar BLB[0] to a logically high signal in between a dummy read operation and a write operation.

PMOS transistors P1 and P2 are configured to control a bit line signal BL on the bit line BL[0] and a bit line bar signal BLB on the bit line bar BLB[0]. PMOS transistors P1 and P2 are configured to selectively adjust the voltage of the bit line signal BL on the bit line BL[0] or the voltage of the bit line bar signal BLB on the bit line bar BLB[0]. In some embodiments, PMOS transistors P1 and P2 are configured to pre-charge the voltage of the bit line signal BL on the bit line BL[0] or the voltage of the bit line bar signal BLB on the bit line bar BLB[0] to a logically high signal.

PMOS transistor P3 is configured to selectively connect the bit line BL[0] to the bit line bar BLB[0]. The gate of PMOS transistor P3 is connected to the bit line equalization line 304. The gate of PMOS transistor P3 is configured to receive the second bit line control signal BLEQB. In some embodiments, the second bit line control signal BLEQB is an enable/disable signal which selectively turns on/off PMOS transistor P3. In some embodiments, PMOS transistor P3 is configured to equalize both the bit line BL[0] and the bit line bar BLB[0] to a third intermediate voltage level. In some embodiments, PMOS transistor P3 is configured to pull a voltage level (e.g., BL and BLB) on both the bit line BL[0] and the bit line bar BLB[0], toward a third intermediate voltage level after a read operation of memory circuit 100. In some embodiments, PMOS transistor P3 is configured to pull a voltage level (e.g., BL and BLB) on both the bit line BL[0] and the bit line bar BLB[0], toward a third intermediate voltage level after a dummy read operation of memory circuit 100. In some embodiments, PMOS transistor P3 is configured to pull a voltage level (e.g., BL and BLB) on both the bit line BL[0] and the bit line bar BLB[0], toward a third intermediate voltage level prior to a write operation of memory circuit 100.

In some embodiments, one or more of PMOS transistors P1, P2 or P3 includes three-dimensional gate structures, e.g., FinFETs. In some embodiments, NMOS transistors are utilized in place of PMOS transistors P1, P2 and P3 in the bit line control unit 300.

FIG. 4A is a waveform diagram of signals applied to memory circuit 100 in accordance with one or more embodiments. Curve 402 represents the clock signal CLK; curve 404a represents the signal on the word line WL (e.g., word line WL[0] shown in FIGS. 1 and 2A); curve 404b represents the non-suppressed signal on the word line WL (e.g., word line WL[0] shown in FIG. 2A); curve 404c represents a portion of the suppressed signal on the word line WL (e.g., word line WL[0] shown in FIG. 2A); curves 406a, 406b represent the bit line/bit line bar signal BL/BLB (e.g., bit line BL[0] shown in FIG. 3 and bit line bar BLB[0] shown in FIG. 3); curve 408 represents the second bit line control signal BLEQB (as shown in FIGS. 1 and 3); curve 410 represents the first bit line control signal PCH (as shown in FIGS. 1 and 3); and curve 412 represents the first voltage control signal RAE (as shown in FIGS. 1 and 2A).

FIG. 4A shows waveforms of various signals when a read and a write operation are performed on memory circuit 100 in one clock cycle (e.g., double-pumped access).

At time T1, curve 402 (e.g., clock signal CLK) transitions from a logically low signal to a logically high signal.

At time T2, curve 402 (e.g., clock signal CLK) finishes transitioning from a logically low signal to a logically high signal. At time T2, curve 408 (e.g., second bit line control signal BLEQB), curve 410 (e.g., first bit line control signal PCH) and curve 412 (e.g., first voltage control signal RAE) start transitioning from a logically low signal to a logically high signal.

In some embodiments, when curve 412 transitions to a logically high signal, the first read assist unit 200 (shown in FIG. 2A) is activated. In some embodiments, when curve 412 transitions to a logically high signal, each of the NMOS transistors N1[0], . . . N1[Y−1] in the first read assist unit 200 (shown in FIG. 2A) are turned on, enabling the first read assist unit 200 to pull the voltage level on the corresponding word line WL[0] toward a first intermediate voltage level during a read operation of memory circuit 100. In some embodiments, the pulse width of a suppressed word line signal (e.g., curve 404c as shown in FIG. 4A) is controlled by the pulse width of the first voltage control signal RAE. In some embodiments, the suppressed word line signal (e.g., curve 404c as shown in FIG. 4A) is defined between time T5 and T6. In some embodiments, word line signal WL (e.g., curve 404a as shown in FIG. 4A) is suppressed for a portion of the read operation (as shown by curve 404c in FIG. 4A). In some embodiments, word line signal WL (e.g., curve 404a as shown in FIG. 4A) is suppressed for the entire read operation (not shown).

In some embodiments, when curve 410 transitions to a logically high signal, the PMOS transistors P1 and P2 of the bit line control unit 300 (shown in FIG. 3) turn-off, ending the pre-charging of the bit line BL[0] and the bit line bar BLB[0] to VDD. In some embodiments, when curve 412 transitions to a logically high signal, the PMOS transistor P3 of the bit line control unit 300 (shown in FIG. 3) turns-off such that the bit line BL[0] and the bit line bar BLB[0] are selectively disconnected from each other.

At time T3, curve 404a (e.g., word line signal WL) starts transitioning from a logically low signal to a logically high signal (as outlined by curve 404a in FIG. 4A).

At time T4, curve 408 (e.g., second bit line control signal BLEQB), curve 410 (e.g., first bit line control signal PCH) and curve 412 (e.g., first voltage control signal RAE) finish transitioning from a logically low signal to a logically high signal. At time T4, curve 406b (e.g., bit line or bit line bar signal BL or BLB) starts transitioning from a logically high signal to a logically low signal.

At time T5, curve 404a (e.g., word line signal WL) stops transitioning from a logically low signal to a logically high signal (as outlined by curve 404b in FIG. 4A). In some embodiments, since curve 412 (e.g., first voltage control signal RAE) transitioned to a logically high signal, the first read assist unit 200 is activated and pulls the voltage level on the corresponding word line WL[0] toward a first intermediate voltage level. At time T5, curve 404a (e.g., word line signal WL) transitions to a first intermediate voltage level (as shown by curve 404c). The first intermediate signal (as shown by curve 404c) is a suppressed word line voltage level.

At time T6, curve 412 (e.g., first voltage control signal RAE) starts transitioning from a logically high signal to a logically low signal. At time T6, curve 404a (e.g., word line signal WL) starts transitioning from a first intermediate voltage level (as shown by curve 404c) to a logically high signal.

At time T7, curve 412 (e.g., first voltage control signal RAE) finishes transitioning from a logically high signal to a logically low signal. At time T7, curve 404a (e.g., word line signal WL) finishes transitioning from a first intermediate voltage level (as shown by curve 404c) to a logically high signal. In some embodiments, since curve 412 (e.g., first voltage control signal RAE) transitioned to a logically low signal, the first read assist unit 200 is deactivated allowing the voltage level on the corresponding word line WL[0] to approach a logically high level.

At time T8, curve 408 (e.g., second bit line control signal BLEQB) starts transitioning from a logically high signal to a logically low signal.

After time T8, curve 404a (e.g., word line signal WL) starts transitioning from a logically high signal to a logically low signal.

At time T9, curve 408 (e.g., second bit line control signal BLEQB) finishes transitioning from a logically high signal to a logically low signal. At time T9, curves 406a, 406b (e.g., bit line/bit line bar signal BL/BLB) start transitioning to a third intermediate voltage level. In some embodiments, at time T9, curve 406b (e.g., bit line or bit line bar signal BL or BLB) is less than curve 406a (e.g., bit line or bit line bar signal BL or BLB) by a first voltage difference $\Delta V$.

In some embodiments, when curve 408 (e.g., second bit line control signal BLEQB) transitions to a logically low signal, the PMOS transistor P3 of the bit line control unit 300 (shown in FIG. 3) turns-on such that the bit line BL[0] and the bit line bar BLB[0] are selectively connected to each other. If the bit line BL[0] and bit line bar BLB[0] are connected to each other, the voltage level on the bit line BL[0] and bit line bar BLB[0] (e.g., bit line or bit line bar signal BL and BLB) become equalized or substantially equal. In some embodiments, the PMOS transistor P3 of the bit line control unit 300 (shown in FIG. 3) pulls the voltage level on both the bit line BL[0] and bit line bar BLB[0] toward a third intermediate voltage level.

After time T9, curve 404a (e.g., word line signal WL) finishes transitioning from a logically high signal to a logically low signal.

At time T10, curves 406a, 406b (e.g., bit line/bit line bar signal BL/BLB) finish transitioning to a third intermediate voltage level. In some embodiments, the third intermediate voltage level is less than the logically high level by a second voltage difference ΔV/2. In some embodiments, the third intermediate voltage level is greater than a threshold voltage $V_{safe}$. The threshold voltage $V_{safe}$ is a threshold voltage of the bit line/bit line bar signal BL/BLB which improves the static noise margin (SNM) of the memory cells in the first memory cell array 102. As shown in FIG. 4A, since the voltage level on the bit line BL[0] and bit line bar BLB[0] (e.g., bit line or bit line bar signal BL and BLB) are equalized to a third intermediate voltage level after time T10, and the third intermediate voltage level is greater than the threshold voltage $V_{safe}$, the bit line BL[0] and the bit line bar BLB[0] do not have to be pre-charged to a logically high voltage level (e.g., voltage level VDD) between a read operation and a write operation, and the SNM of the first memory cell array 102 is not adversely affected.

At time T11, curve 402 (e.g., clock signal CLK) starts transitioning from a logically high signal to a logically low signal. At time T11, curve 408 (e.g., second bit line control signal BLEQB) starts transitioning from a logically low signal to a logically high signal.

After time T11, curve 404a (e.g., word line signal WL) starts transitioning from a logically low signal to a logically high signal.

At time T12, curve 402 (e.g., clock signal CLK) finishes transitioning from a logically high signal to a logically low signal. At time T12, curve 408 (e.g., second bit line control signal BLEQB) finishes transitioning from a logically low signal to a logically high signal. In some embodiments, when curve 408 transitions to a logically high signal, the PMOS transistor P3 of the bit line control unit 300 (shown in FIG. 3) turns-off such that the bit line BL[0] and the bit line bar BLB[0] are selectively disconnected from each other. At time T12, curve 406b (e.g., bit line or bit line bar signal BL or BLB) starts transitioning from a third intermediate voltage level to a logically low signal. In some embodiments, the second bit line control signal BLEQB triggers the equalization of the bit line and the bit line bar signal BL or BLB.

At time T13, curve 404a (e.g., word line signal WL) finishes transitioning from a logically low signal to a logically high signal.

At time T14, curve 408 (e.g., second bit line control signal BLEQB) and curve 410 (e.g., first bit line control signal PCH) start transitioning from a logically high signal to a logically low signal.

After time T14, curve 404a (e.g., word line signal WL) starts transitioning from a logically high signal to a logically low signal.

At time T15, curve 408 (e.g., second bit line control signal BLEQB) and curve 410 (e.g., first bit line control signal PCH) finish transitioning from a logically high signal to a logically low signal. At time T15, curves 406a, 406b (e.g., bit line/bit line bar signal BL/BLB) start transitioning to a logically high signal.

In some embodiments, when curve 410 transitions to a logically low signal, the PMOS transistors P1 and P2 of the bit line control unit 300 (shown in FIG. 3) turn-on, and the bit line BL[0] and the bit line bar BLB[0] are pre-charged to VDD for the next clock cycle.

In some embodiments, when curve 408 transitions to a logically low signal, the PMOS transistor P3 of the bit line control unit 300 (shown in FIG. 3) turns-on such that the bit line BL[0] and the bit line bar BLB[0] are selectively connected to each other and the voltage level on the bit line L[0] and bit line bar BLB[0] (e.g., bit line or bit line bar signal BL and BLB) are equalized.

At T16, curve 404a (e.g., word line signal WL) finishes transitioning from a logically high signal to a logically low signal. At time T16, curves 406a, 406b (e.g., bit line/bit line bar signal BL/BLB) finish transitioning to a logically high signal.

As shown in FIG. 4A, by utilizing both the first read assist unit 200 of FIG. 2A (to suppress the word line voltage level WL during a read operation) and the bit line control unit 300 of FIG. 3 (to equalize the bit line/bit line bar voltage level prior to a write operation) in the memory cell circuit 100 shown in FIG. 1, the SNM of the memory cell array 102 can be improved. Furthermore, by equalizing the bit line/bit line bar voltage level prior to a write operation in the memory cell circuit 100, the amount of energy to pre-charge the bit line BL/bit line bar BLB is reduced. In some embodiments, the SNM of the dummy read memory cell 102 is improved from the equalized and non-pre-charged bit line/bit line bar voltage level with a non-suppressed word line voltage level during the write operation from time T12 to time T15.

FIG. 4B is a waveform diagram of signals applied to memory circuit 100 in accordance with one or more embodiments. Curve 402 represents the clock signal CLK; curve 414 represents the signal on the word line WL (e.g., word line WL[0] shown in FIGS. 1 and 2A); curve 416a represents the signal on the word line WL_R (e.g., word line WL_R shown in FIG. 2B) of the second read assist unit 200'; curve 416b represents the non-suppressed signal on the word line WL_R (e.g., word line WL_R shown in FIG. 2B) of the second read assist unit 200'; curve 416c represents a portion of the suppressed signal on the word line WL_R (e.g., word line WL_R shown in FIG. 2B) of the second read assist unit 200'; curves 418a, 418b represent the bit line/bit line bar signal BL/BLB (e.g., bit line BL[0] shown in FIG. 3 and bit line bar BLB[0] shown in FIG. 3); curve 420 represents the second voltage control signal RAE_R1 (as shown in FIGS. 1 and 2B) of the second read assist unit 200'; curve 422 represents the second bit line control signal BLEQB (as shown in FIGS. 1 and 3); and curve 424 represents the first bit line control signal PCH (as shown in FIGS. 1 and 3).

FIG. 4B shows waveforms of various signals when a dummy read operation and a write operation are performed on memory circuit 100 in one clock cycle (e.g., double-pumped access).

At time T1, curve 402 (e.g., clock signal CLK) transitions from a logically low signal to a logically high signal.

At time T2, curve 402 (e.g., clock signal CLK) finishes transitioning from a logically low signal to a logically high signal. At time T2, curve 422 (e.g., second bit line control signal BLEQB), curve 424 (e.g., first bit line control signal PCH) and curve 420 (e.g., second voltage control signal RAE_R1) start transitioning from a logically low signal to a logically high signal.

In some embodiments, when curve 420 transitions to a logically high signal, the second read assist unit 200' (shown in FIG. 2B) is activated. In some embodiments, when curve 420 transitions to a logically high signal, each of the NMOS transistors N1[0], . . . N1[Y−1] in the second read assist unit 200' (shown in FIG. 2B) are turned on, enabling the second read assist unit 200' to pull the voltage level on the corresponding word line WL_R toward a first intermediate voltage level during a dummy read operation of memory circuit 100. In some embodiments, the pulse width of a suppressed word line signal (e.g., curve 416c as shown in FIG. 4B) is controlled by the pulse width of the second voltage control signal RAE_R1. In some embodiments, the suppressed word line signal (e.g., curve 416c as shown in FIG. 4B) is defined between time T5 and T6. In some embodiments, word line signal WL (e.g., curve 416a as shown in FIG. 4B) is suppressed for a portion of the read operation (as shown by curve 416c in FIG. 4B). In some embodiments, word line signal WL (e.g., curve 416a as shown in FIG. 4B) is suppressed for the entire read operation (not shown).

In some embodiments, when curve 424 transitions to a logically high signal, the PMOS transistors P1 and P2 of the bit line control unit 300 (shown in FIG. 3) turn-off, ending the pre-charging of the bit line BL[0] and the bit line bar BLB[0] to VDD. In some embodiments, when curve 420 transitions to a logically high signal, the PMOS transistor P3 of the bit line control unit 300 (shown in FIG. 3) turns-off such that the bit line BL[0] and the bit line bar BLB[0] are selectively disconnected from each other.

At time T3, curve 416a (e.g., word line signal WL_R) starts transitioning from a logically low signal to a logically high signal (as outlined by curve 416a in FIG. 4B).

At time T4, curve 422 (e.g., second bit line control signal BLEQB), curve 424 (e.g., first bit line control signal PCH) and curve 420 (e.g., second voltage control signal RAE_R1) finish transitioning from a logically low signal to a logically high signal. At time T4, curve 418b (e.g., bit line or bit line bar signal BL or BLB) starts transitioning from a logically high signal to a logically low signal.

At time T5, curve 416a (e.g., word line signal WL_R) stops transitioning from a logically low signal to a logically high signal (as outlined by curve 416b in FIG. 4A). In some embodiments, since curve 412 (e.g., first voltage control signal RAE) transitioned to a logically high signal, the read assist unit 200 is activated and pulls the voltage level on the corresponding word line WL[0] toward a first intermediate voltage level. At time T5, curve 404a (e.g., word line signal WL) transitions to a first intermediate voltage level (as shown by curve 404c). The first intermediate signal (as shown by curve 404c) is a suppressed word line voltage level.

At time T6, curve 420 (e.g., second voltage control signal RAE_R1) starts transitioning from a logically high signal to a logically low signal.

After time T6, curve 416a (e.g., word line signal WL_R) starts transitioning from a first intermediate voltage level (as shown by curve 416c) to a logically high signal.

At time T7, curve 420 (e.g., second voltage control signal RAE_R1) finishes transitioning from a logically high signal to a logically low signal. At time T7, curve 416a (e.g., word line signal WL) finishes transitioning from a first intermediate voltage level (as shown by curve 416c) to a logically high signal. In some embodiments, since curve 420 (e.g., second voltage control signal RAE_R1) transitioned to a logically low signal, the second read assist unit 200' is deactivated allowing the voltage level on the word line WL_R to approach a logically high level.

At time T8, curve 422 (e.g., second bit line control signal BLEQB) starts transitioning from a logically high signal to a logically low signal.

After time T8, curve 416a (e.g., word line signal WL_R) starts transitioning from a logically high signal to a logically low signal.

At time T9, curve 422 (e.g., second bit line control signal BLEQB) finishes transitioning from a logically high signal to a logically low signal. At time T9, curves 418a, 418b (e.g., bit line/bit line bar signal BL/BLB) start transitioning to a third intermediate voltage level. In some embodiments, at time T9, curve 418b (e.g., bit line or bit line bar signal BL or BLB) is less than curve 418a (e.g., bit line or bit line bar signal BL or BLB) by a first voltage difference ΔV.

In some embodiments, when curve 422 (e.g., second bit line control signal BLEQB) transitions to a logically low signal, the PMOS transistor P3 of the bit line control unit 300 (shown in FIG. 3) turns-on such that the bit line BL[0] and the bit line bar BLB[0] are selectively connected to each other. If the bit line BL[0] and bit line bar BLB[0] are connected to each other, the voltage level on the bit line BL[0] and bit line bar BLB[0] (e.g., bit line or bit line bar signal BL and BLB) become equalized or substantially equal. In some embodiments, the PMOS transistor P3 of the bit line control unit 300 (shown in FIG. 3) pulls the voltage level on both the bit line BL[0] and bit line bar BLB[0] toward a third intermediate voltage level.

After time T9, curve 416a (e.g., word line signal WL_R) finishes transitioning from a logically high signal to a logically low signal.

At time T10, curves 418a, 418b (e.g., bit line/bit line bar signal BL/BLB) finish transitioning to a third intermediate voltage level. In some embodiments, the third intermediate voltage level is less than the logically high level by a second voltage difference ΔV/2. In some embodiments, the third intermediate voltage level is greater than a threshold voltage $V_{safe}$. As shown in FIG. 4B, since the voltage level on the bit line BL[0] and bit line bar BLB[0] (e.g., bit line or bit line bar signal BL and BLB) are equalized to a third intermediate voltage level after time T10, and the third intermediate voltage level is greater than the threshold voltage $V_{safe}$, the bit line BL[0] and the bit line bar BLB[0] do not have to be pre-charged to a logically high voltage level (e.g., voltage level VDD) between a dummy read operation and a write operation, and the SNM of the first memory cell array 102 is not adversely affected.

At time T11, curve 402 (e.g., clock signal CLK) starts transitioning from a logically high signal to a logically low signal. At time T11, curve 422 (e.g., second bit line control signal BLEQB) starts transitioning from a logically low signal to a logically high signal.

After time T11, curve 414 (e.g., word line signal WL) starts transitioning from a logically low signal to a logically high signal.

At time T12, curve 402 (e.g., clock signal CLK) finishes transitioning from a logically high signal to a logically low signal. At time T12, curve 422 (e.g., second bit line control signal BLEQB) finishes transitioning from a logically low signal to a logically high signal. In some embodiments, when curve 422 transitions to a logically high signal, the PMOS transistor P3 of the bit line control unit 300 (shown in FIG. 3) turns-off such that the bit line BL[0] and the bit line bar BLB[0] are selectively disconnected from each other. At time T12, curve 418b (e.g., bit line or bit line bar signal BL or BLB) starts transitioning from a third intermediate voltage level to a logically low signal. In some embodiments, the second bit line control signal BLEQB triggers the equalization of the bit line and the bit line bar signal BL or BLB.

At time T13, curve 414 (e.g., word line signal WL) finishes transitioning from a logically low signal to a logically high signal.

At time T14, curve 422 (e.g., second bit line control signal BLEQB) and curve 424 (e.g., first bit line control signal PCH) start transitioning from a logically high signal to a logically low signal.

After time T14, curve 414 (e.g., word line signal WL) starts transitioning from a logically high signal to a logically low signal.

At time T15, curve 422 (e.g., second bit line control signal BLEQB) and curve 424 (e.g., first bit line control signal PCH) finish transitioning from a logically high signal to a logically low signal. At time T15, curves 418a, 418b (e.g., bit line/bit line bar signal BL/BLB) start transitioning to a logically high signal.

In some embodiments, when curve 424 transitions to a logically low signal, the PMOS transistors P1 and P2 of the bit line control unit 300 (shown in FIG. 3) turn-on, and the bit line BL[0] and the bit line bar BLB[0] are pre-charged to VDD for the next clock cycle.

In some embodiments, when curve 422 transitions to a logically low signal, the PMOS transistor P3 of the bit line control unit 300 (shown in FIG. 3) turns-on such that the bit line BL[0] and the bit line bar BLB[0] are selectively connected to each other and the voltage level on the bit line BL[0] and bit line bar BLB[0] (e.g., bit line or bit line bar signal BL and BLB) are equalized.

At T16, curve 414 (e.g., word line signal WL) finishes transitioning from a logically high signal to a logically low signal. At time T16, curves 418a, 418b (e.g., bit line/bit line bar signal BL/BLB) finish transitioning to a logically high signal.

As shown in FIG. 4B, by utilizing both the second read assist unit 200' of FIG. 2B (to suppress the replicated word line voltage level WL during a dummy read operation) and the bit line control unit 300 of FIG. 3 (to equalize the bit line/bit line bar voltage level prior to a write operation) in the memory cell circuit 100 shown in FIG. 1, the SNM of the memory cell array 102 can, in some embodiments, be improved. Furthermore, by equalizing the bit line/bit line bar voltage level prior to a write operation in the memory cell circuit 100, the amount of energy to pre-charge the bit line BL/bit line bar BLB is reduced.

Figure 5B:
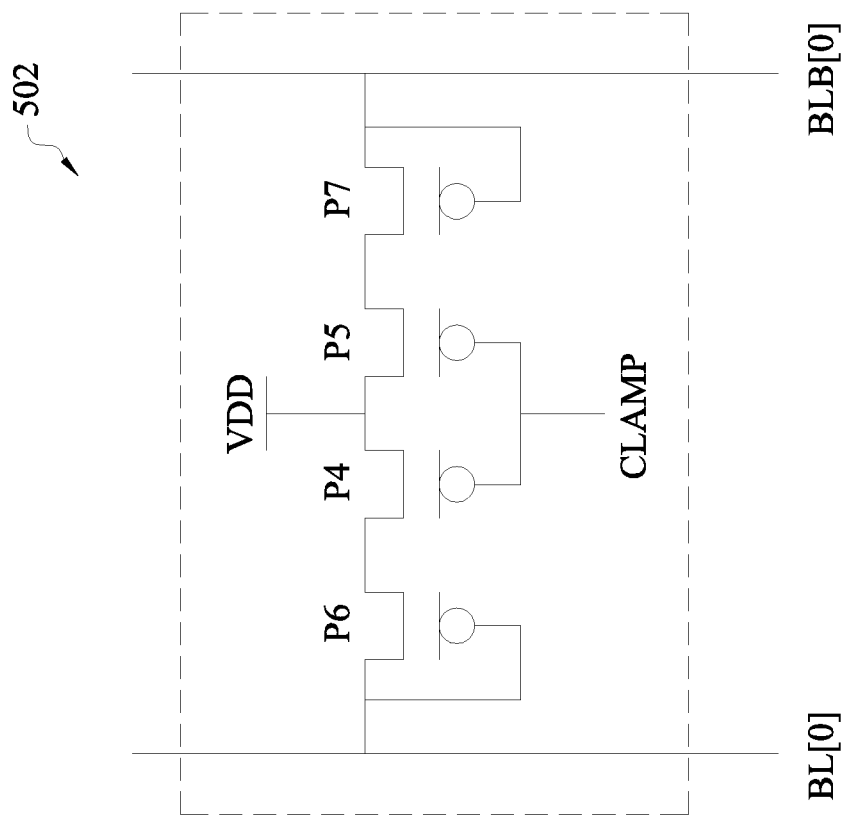
FIG. 5B is schematic diagram of a clamping unit in accordance with some embodiments.
Figure 5A:
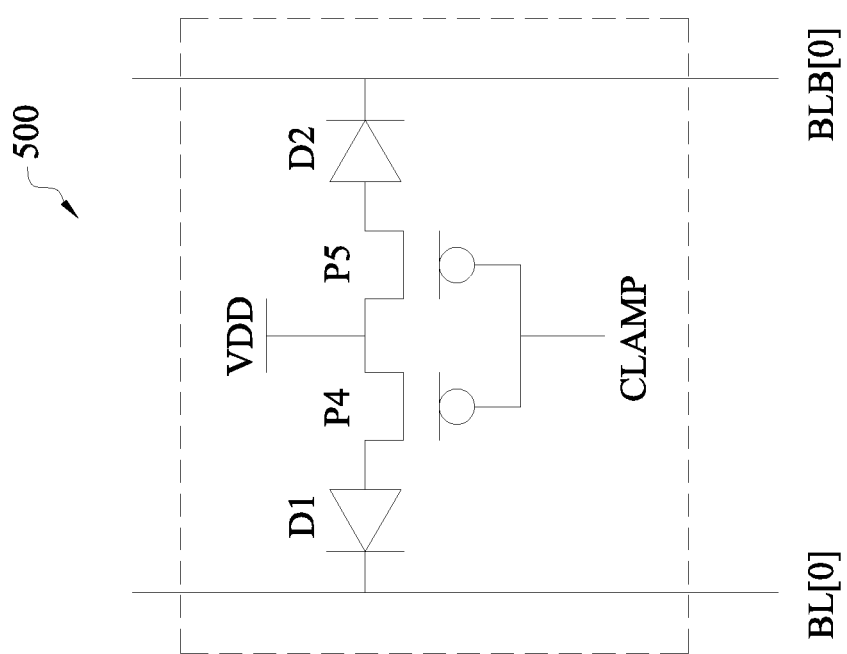
FIG. 5A is schematic diagram of a clamping unit in accordance with some embodiments.

FIG. 5A is a schematic diagram of a clamping unit 500 in accordance with one or more embodiments. Clamping unit 500 is an embodiment of clamping unit 110[0] shown in FIG. 1. Bit line BL[0] is an embodiment of bit line BL[0] shown in FIG. 1. Bit line bar BLB[0] is an embodiment of bit line bar BLB[0] shown in FIG. 1.

Clamping unit 500 is configured to receive a first clamping control signal CLAMP. The first clamping control signal CLAMP is, e.g., a logically low signal or a logically high signal. In some embodiments, the first clamping control signal CLAMP activates the corresponding clamping unit 500, if the first clamping control signal CLAMP transitions from a logically high signal to a logically low signal. In some embodiments, the first clamping control signal CLAMP deactivates the corresponding clamping unit 500, if the first clamping control signal CLAMP transitions from a logically low signal to a logically high signal.

Clamping unit 500 is configured to control a bit line signal BL on the bit line BL[0] or a bit line bar signal BLB on the bit line bar BLB[0]. In some embodiments, clamping unit 500 is configured to selectively adjust the voltage of the bit line signal BL on the bit line BL[0] or the voltage of the bit line bar signal BLB on the bit line bar BLB[0]. In some embodiments, clamping unit 500 is configured to pull or clamp the voltage level on both the bit line BL[0] and the bit line bar BLB[0] to a second intermediate voltage level.

Clamping unit 500 includes PMOS transistors P4 and P5, diodes D1 and D2, bit line BL[0] and bit line bar BLB[0].

The source of each PMOS transistor P4 and P5 is connected to a voltage source VDD. The drain of PMOS transistor P4 is connected to the anode of diode D1. The drain of PMOS transistor P5 is connected to the anode of diode D2. The gates of PMOS transistors P4 and P5 are both connected to a clamp line 502. The gate of each PMOS transistor P4 and P5 is configured to receive the first clamping control signal CLAMP. In some embodiments, the first clamping control signal CLAMP is an enable/disable signal which selectively turns on/off each PMOS transistor P4 and P5.

Diode D1 is arranged in a forward-biased configuration. The anode of diode D1 is electrically connected to PMOS transistor P4. The cathode of diode D1 is electrically connected to the bit line BL[0]. In some embodiments, multiple diodes are connected in series in place of diode D1.

Diode D2 is arranged in a forward-biased configuration. The anode of diode D2 is electrically connected to PMOS transistor P5. The cathode of diode D2 is electrically connected to the bit line bar BLB[0]. In some embodiments, multiple diodes are connected in series in place of diode D2.

Figure 7:
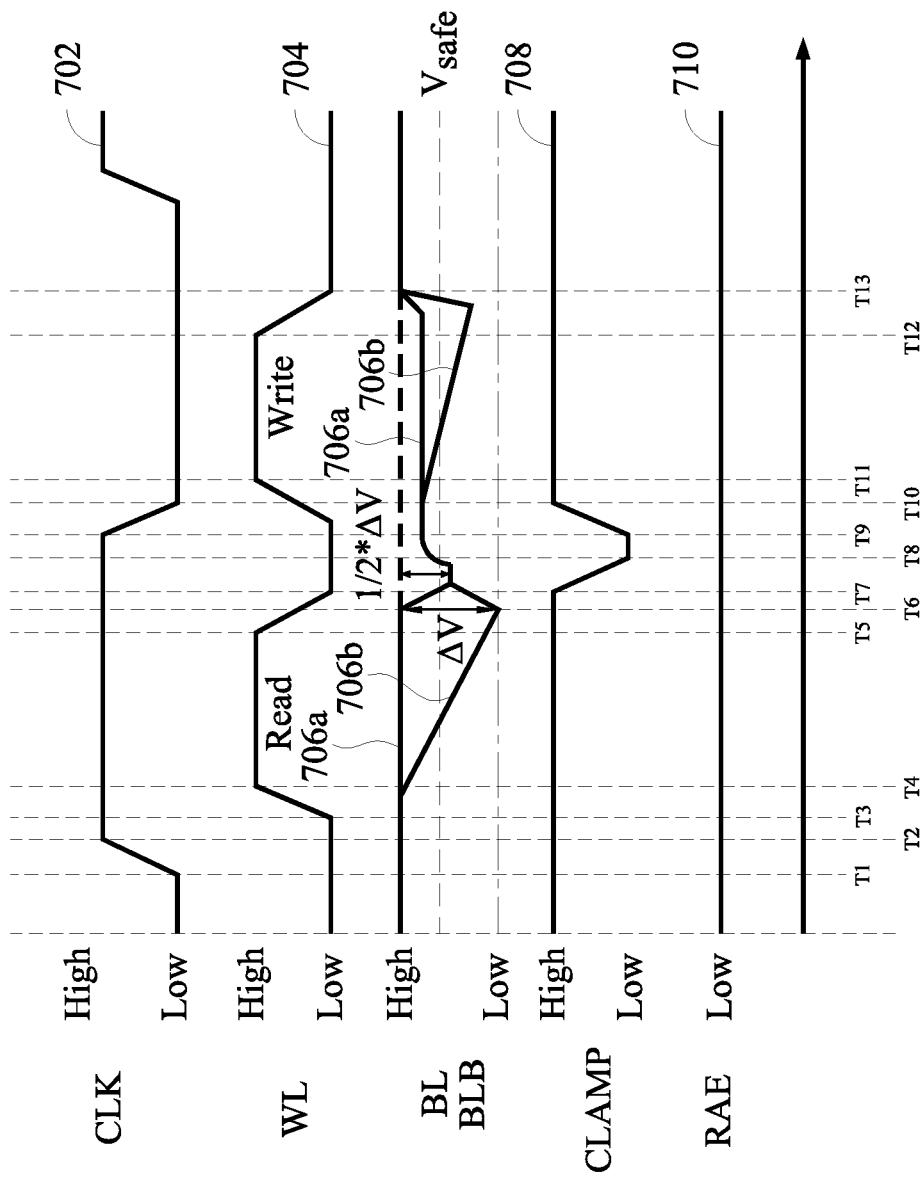
FIG. 7 is a waveform diagram of signals applied to memory circuit 100 in accordance with one or more embodiments.

In some embodiments, for one clock cycle, PMOS transistors P4 and P5 turn-on in between a read operation and a write operation (as shown in FIG. 7), and the voltage level on both the bit line BL[0] and the bit line bar BLB[0] are pulled or clamped to a second intermediate voltage level. In some embodiments, for one clock cycle, PMOS transistors P4 and P5 turn-on in between a dummy read operation and a write operation (as shown in FIG. 7), and the voltage level on both the bit line BL[0] and the bit line bar BLB[0] are pulled or clamped to a second intermediate voltage level.

In some embodiments, for one clock cycle, PMOS transistors P4 and P5 turn-off during a read operation or a write operation (as shown in FIG. 7), and the voltage level on either the bit line BL[0] or the bit line bar BLB[0] is not pulled or clamped to the second intermediate voltage level. In some embodiments, for one clock cycle, PMOS transistors P4 and P5 turn-off during a dummy read operation or a write operation (as shown in FIG. 7), and the voltage level on either the bit line BL[0] or the bit line bar BLB[0] is not pulled or clamped to a second intermediate voltage level.

In some embodiments, one or more of PMOS transistors P4 or P5 includes three-dimensional gate structures, e.g. FinFETs. In some embodiments, NMOS transistors are utilized in place of PMOS transistors P4 and P5 in the clamping unit 500.

FIG. 5B is a schematic diagram of a clamping unit 504 in accordance with one or more embodiments. Clamping unit 504 is an embodiment of clamping unit 110[0] shown in FIG. 1 with similar elements. Clamping unit 504 is also an embodiment of clamping unit 500 shown in FIG. 5A with similar elements. In comparison with FIG. 5A, the clamping unit 504 (of FIG. 5B) includes PMOS transistor P6 instead of diode D1. In comparison with FIG. 5A, the clamping unit 504 (of FIG. 5B) includes PMOS transistor P7 instead of diode D2.

The source of PMOS transistor P6 is connected to the drain of PMOS transistor P4. PMOS transistor P6 is connected in a diode configuration such that the gate of PMOS transistor P6 is connected to the drain of PMOS transistor P6. The drain and gate of PMOS transistor P6 are connected to the bit line BL[0].

The source of PMOS transistor P7 is connected to the drain of PMOS transistor P5. PMOS transistor P7 is connected in a diode configuration such that the gate of PMOS transistor P7 is connected to the drain of PMOS transistor P7. The drain and gate of PMOS transistor P7 are connected to the bit line bar BLB[0].

In some embodiments, multiple PMOS connected diodes are connected in series in place of PMOS connected diode P6. In some embodiments, multiple PMOS connected diodes are connected in series in place of PMOS connected diode P7. In some embodiments, one or more of PMOS transistors P5 or P6 includes three-dimensional gate structures, e.g. FinFETs.

Figures 5C, 5D:
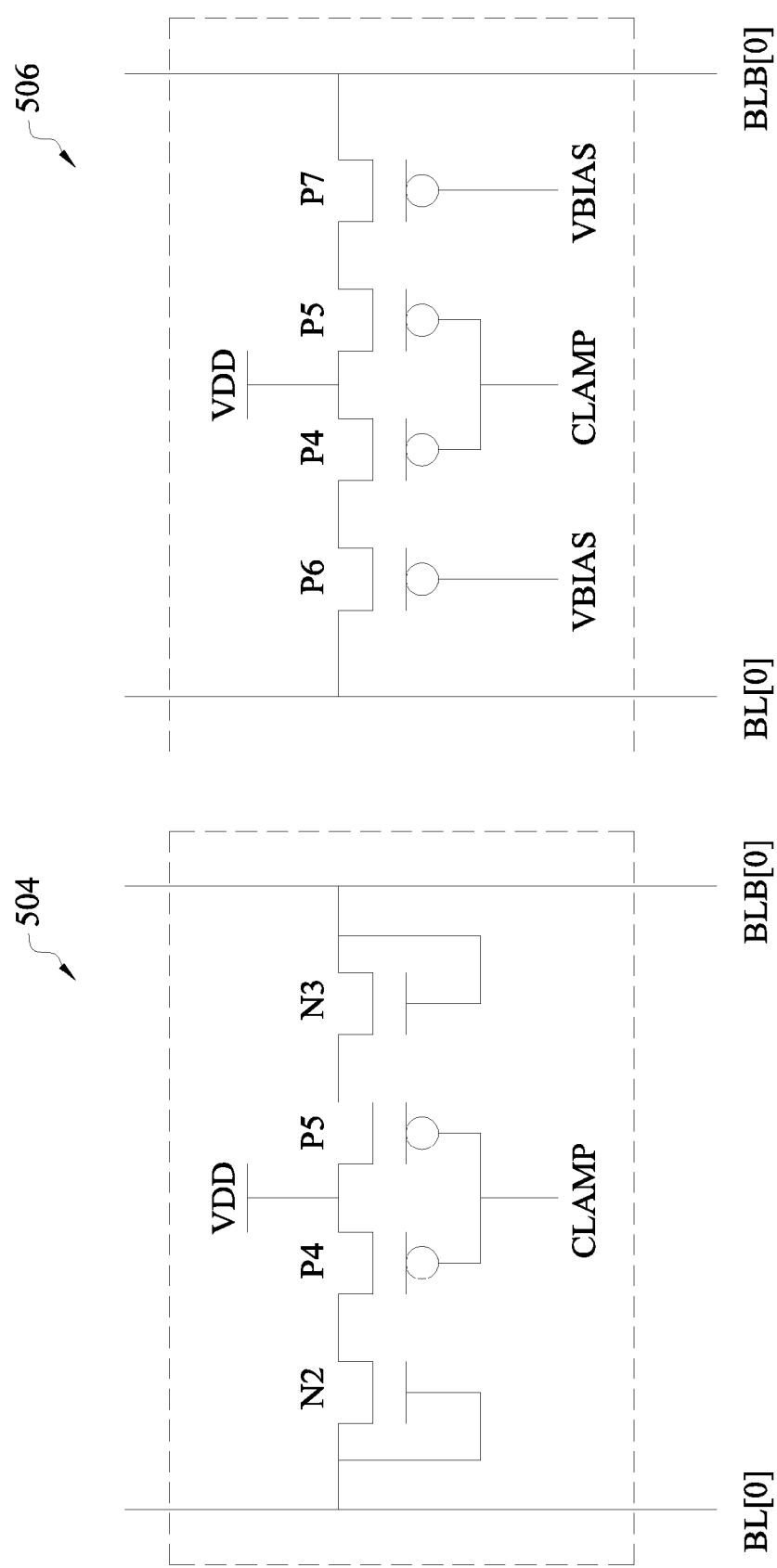
FIG. 5C is schematic diagram of a clamping unit in accordance with some embodiments.
FIG. 5D is schematic diagram of a clamping unit in accordance with some embodiments.

FIG. 5C is a schematic diagram of a clamping unit 506 in accordance with one or more embodiments. Clamping unit 506 is an embodiment of clamping unit 110[0] shown in FIG. 1 with similar elements. Clamping unit 506 is also an embodiment of clamping unit 500 shown in FIG. 5A with similar elements. In comparison with FIG. 5A, the clamping unit 506 (of FIG. 5C) includes NMOS transistor N2 instead of diode D1. In comparison with FIG. 5A, the clamping unit 506 (of FIG. 5C) includes NMOS transistor N3 instead of diode D2.

The drain of NMOS transistor N2 is connected to the drain of PMOS transistor P4. NMOS transistor N2 is connected in a diode configuration such that the gate of NMOS transistor N2 is connected to the source of NMOS transistor N2. The source and gate of NMOS transistor N2 are connected to the bit line BL[0].

The drain of NMOS transistor N3 is connected to the drain of PMOS transistor P5. NMOS transistor N3 is connected in a diode configuration such that the gate of NMOS transistor N3 is connected to the source of NMOS transistor N3. The source and gate of NMOS transistor N3 are connected to the bit line bar BLB[0].

In some embodiments, multiple NMOS connected diodes are connected in series in place of NMOS connected diode N2. In some embodiments, multiple NMOS connected diodes are connected in series in place of NMOS connected diode N3. In some embodiments, one or more of NMOS transistors N2 or N3 includes three-dimensional gate structures, e.g., FinFETs.

FIG. 5D is a schematic diagram of a clamping unit 508 in accordance with one or more embodiments. Clamping unit 508 is an embodiment of clamping unit 110[0] shown in FIG. 1 with similar elements. Clamping unit 508 is also an embodiment of clamping unit 504 shown in FIG. 5B with similar elements. In comparison with FIG. 5B, the PMOS transistor P6 of clamping unit 508 (of FIG. 5D) is not arranged in a diode configuration. In comparison with FIG. 5B, the PMOS transistor P7 of clamping unit 508 (of FIG. 5D) is not arranged in a diode configuration.

The source of PMOS transistor P6 is connected to the drain of PMOS transistor P4. The drain of PMOS transistor P6 is connected to the bit line BL[0]. The gate of PMOS transistor P6 is connected to a voltage bias signal VBIAS. The voltage bias signal VBIAS is a biasing voltage that ranges from about a logically low signal to about a logically high signal. In some embodiments, the PMOS transistor P6 is configured as a resistor. In some embodiments, the voltage bias signal VBIAS is utilized to bias the PMOS transistor P6 as a resistor. The voltage bias signal VBIAS is generated by a voltage generator unit. In some embodiments, the voltage generator unit is implemented by one or more of the configurations shown in FIGS. 6A-6B.

The source of PMOS transistor P7 is connected to the drain of PMOS transistor P5. The drain of PMOS transistor P7 is connected to the bit line bar BLB[0]. The gate of PMOS transistor P7 is connected to a voltage bias signal VBIAS. In some embodiments, the PMOS transistor P7 is configured as a resistor. In some embodiments, the voltage bias signal VBIAS is utilized to bias the PMOS transistor P7 as a resistor.

In some embodiments, multiple PMOS transistor devices are connected in series in place of PMOS transistor P6. In some embodiments, multiple PMOS transistor devices are connected in series in place of PMOS transistor P7.

Figure 6B:
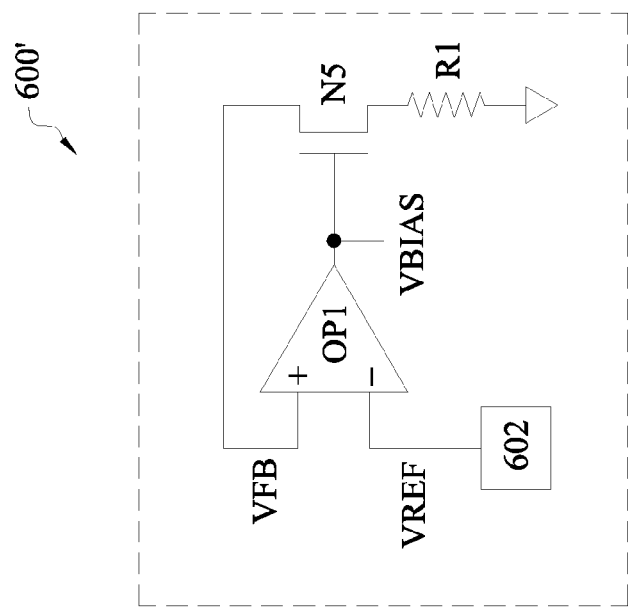
FIG. 6B is a schematic diagram of a voltage generator unit in accordance with some embodiments.
Figure 6A:
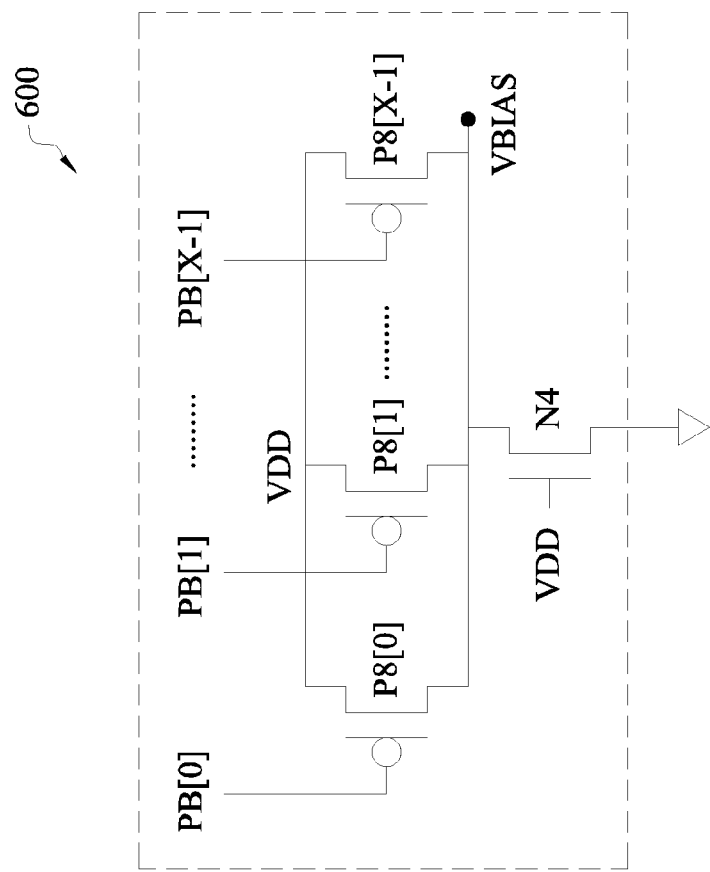
FIG. 6A is a schematic diagram of a voltage generator unit in accordance with some embodiments.

FIG. 6A is a schematic diagram of a voltage generator unit 600 in accordance with one or more embodiments.

Voltage generator unit 600 is configured to receive a programmable bias signal PB[0], . . . PB[X−1], where X is an integer corresponding to the number of PMOS transistors in the voltage generator unit 600. The programmable bias signal PB[0], . . . PB[X−1] is, e.g., a logically low signal or a logically high signal. In some embodiments, one or more of the programmable bias signals PB[0], . . . PB[X−1] activates the corresponding voltage generator unit 600, if one or more of the programmable bias signals PB[0], . . . PB[X−1] transitions from a logically high signal to a logically low signal. In some embodiments, the programmable bias signals PB[0], . . . PB[X−1] deactivates the corresponding voltage generator unit 600, if each of the programmable bias signals PB[0], . . . PB[X−1] transition from a logically low signal to a logically high signal. Voltage generator unit 600 is configured to generate a bias voltage VBIAS.

Voltage generator unit 600 includes PMOS transistors P8[0], . . . P8[X−1] and NMOS transistor N4, where X is an integer corresponding to the number of PMOS transistors in the voltage generator unit 600. In some embodiments, X is an integer ranging from 1 to 8.

Each PMOS transistor P8[0], . . . N8[X−1] is connected in a parallel configuration. The gate of each PMOS transistor P8[0], . . . N8[X−1] is configured to receive the programmable bias signal PB[0], . . . P8[X−1]. In some embodiments, the programmable bias signal PB[0], . . . PB[X−1] is an enable/disable signal which selectively turns on/off each PMOS transistor P8[0], . . . N8[X−1]. The source of each PMOS transistor P8[0], . . . N8[X−1] is connected to a voltage source VDD. The drain of each PMOS transistor P8[0], . . . N8[X−1] is connected to the drain of NMOS transistor N4, and to the terminal of the voltage bias signal VBIAS. The gate of NMOS transistor N4 is connected to voltage source VDD. The source of NMOS transistor N4 is connected to a ground voltage VSS. PMOS transistor P8[0], . . . N8[X−1] and NMOS transistor N4 are arranged in a voltage divider configuration.

In some embodiments, if a programmable bias signals PB[0], . . . PB[X−1] transitions from a logically high signal to a logically low signal, the corresponding PMOS transistor P8[0], . . . N8[X−1] is activated. As the number of PMOS transistors P8[0], . . . N8[X−1] are activated, the voltage bias signal VBIAS increases in value approaching the value of the voltage source VDD. As the number of PMOS transistors P8[0], . . . N8[X−1] are deactivated, the voltage bias signal VBIAS increases in value approaching the value of the ground voltage VSS.

FIG. 6B is a schematic diagram of a voltage generator unit 600' in accordance with one or more embodiments.

Voltage generator unit 600' is configured to generate a bias voltage VBIAS. Voltage generator unit 600' includes a bandgap reference unit 602, an operational amplifier OP1, an NMOS transistor N5, and a resistor R1.

Bandgap reference unit 602 is configured to generate a reference voltage signal VREF. Bandgap reference unit 602 is a voltage generator device which generates a temperature independent reference voltage signal VREF. Bandgap reference unit 602 is connected to the inverting terminal of the operational amplifier OP1.

Operational amplifier OP1 is configured to receive a reference voltage signal VREF from a bandgap reference unit 602. The reference voltage signal VREF is a reference voltage at the inverting terminal of the operational amplifier OP1. Operational amplifier OP1 is configured to receive a feedback reference voltage signal VFB from an NMOS transistor N5. The feedback reference voltage signal VFB is a voltage at the non-inverting terminal of the operational amplifier OP1. Operational amplifier OP1 is configured to send a bias voltage VBIAS to NMOS transistor N5 and to the terminal of the voltage bias signal VBIAS. The inverting input terminal of the operational amplifier OP1 is connected to the bandgap reference unit 602. The non-inverting input terminal of the operational amplifier OP1 is connected to the drain of NMOS transistor N5. The output terminal of the operational amplifier OP1 is connected to the gate of NMOS transistor N5 and the terminal of the voltage bias signal VBIAS.

The gate of NMOS transistor N5 is configured to receive a voltage bias signal VBIAS. The drain of NMOS transistor N5 is connected to the inverting terminal of the operational amplifier OP1 forming a feedback loop. The source of NMOS transistor N5 is connected to the resistor R1.

Resistor R1 is connected between the source of NMOS transistor N5 and the ground voltage VSS.

FIG. 7 is a waveform diagram of signals applied to memory circuit 100 in accordance with one or more embodiments. Curve 702 represents the clock signal CLK; curve 704 represents the signal on the word line WL (e.g., word line WL[0] shown in FIGS. 1 and 2A); curves 706a, 706b represent the bit line/bit line bar signal BL/BLB (e.g., bit line BL[0] shown in FIG. 3 and bit line bar BLB[0] shown in FIG. 3); curve 708 represents the first clamping control signal CLAMP (as shown in FIGS. 1 and 5A-5D); and curve 710 represents the first voltage control signal RAE (as shown in FIGS. 1 and 2A).

FIG. 7 shows waveforms of various signals when a read and a write operation are performed on memory circuit 100 in one clock cycle (e.g., double-pumped access).

At time T1, curve 402 (e.g., clock signal CLK) transitions from a logically low signal to a logically high signal.

At time T2, curve 402 (e.g., clock signal CLK) finishes transitioning from a logically low signal to a logically high signal.

At time T3, curve 704 (e.g., word line signal WL) starts transitioning from a logically low signal to a logically high signal (as outlined by curve 704 in FIG. 7). While the first bit line control signal PCH (as shown in FIGS. 1 and 3) is not shown in FIG. 7, one of ordinary skill in the art would understand that the bit line BL[0] and bit line bar BLB[0] are pre-charged to VDD prior to a read (or a dummy read) and a write operation in one clock cycle (e.g., double-pumped access).

At time T4, curve 704 (e.g., word line signal WL) finishes transitioning from a logically low signal to a logically high signal (as outlined by curve 704 in FIG. 7). At time T4, curve 706b (e.g., bit line or bit line bar signal BL or BLB) starts transitioning from a logically high signal to a logically low signal. In some embodiments, since curve 710 (e.g., first voltage control signal RAE) is a logically low signal, the first read assist unit 200 is deactivated and the voltage WL on the word line WL[0] is not suppressed.

At time T5, curve 704 (e.g., word line signal WL) starts transitioning from a logically high signal to a logically low signal.

In some embodiments, at time T6, curve 706b (e.g., bit line or bit line bar signal BL or BLB) is less than curve 706a (e.g., bit line or bit line bar signal BL or BLB) by a first voltage difference ΔV. At time T6, curves 706a, 706b (e.g., bit line/bit line bar signal BL/BLB) start transitioning to a third intermediate voltage level. While the second bit line control signal BLEQB (as shown in FIGS. 1, 3 and 4A-4B) is not shown in FIG. 7, the voltage level of the bit line BL[0] and bit line bar BLB[0] (e.g., BL signal and BLB signal) are pulled, by a bit line control unit 300, to a third intermediate voltage level in between a read (or a dummy read) and a write operation in one clock cycle (e.g., double-pumped access). For example, as shown in FIG. 7, between time T6 and T8, the bit line/bit line bar signal BL/BLB are equalized to a third intermediate voltage level.

At time T7, curve 704 (e.g., word line signal WL) finishes transitioning from a logically high signal to a logically low signal. At time T7, curve 708 (e.g., first clamping control signal CLAMP) starts transitioning from a logically high signal to a logically low signal. At time T7, curves 706a, 706b (e.g., bit line/bit line bar signal BL/BLB) finish transitioning to a third intermediate voltage level. In some embodiments, the third intermediate voltage level is less than the logically high level by a second voltage difference ΔV/2. In some embodiments, the third intermediate voltage level is less than a threshold voltage $V_{safe}$.

At time T8, curve 708 (e.g., first clamping control signal CLAMP) finishes transitioning from a logically high signal to a logically low signal. In some embodiments, when curve 708 transitions to a logically high signal, the clamping unit (e.g., clamping unit 500 shown in FIG. 5A, clamping unit 502 shown in FIG. 5B, clamping unit 504 shown in FIG. 5C or clamping unit 506 shown in FIG. 5D) is activated, and pulls the voltage level (e.g., bit line BL or bit line bar BLB) on the bit line BL[0] and the bit line bar BLB[0] toward a second intermediate voltage level. In some embodiments, when the clamping unit (e.g., clamping unit 500 shown in FIG. 5A, clamping unit 502 shown in FIG. 5B, clamping unit 504 shown in FIG. 5C or clamping unit 506 shown in FIG. 5D) is activated, the PMOS transistors P4 and P5 within the clamping unit (e.g., clamping unit 500 shown in FIG. 5A, clamping unit 502 shown in FIG. 5B, clamping unit 504 shown in FIG. 5C or clamping unit 506 shown in FIG. 5D) are turned-on, and pull the voltage level (e.g., bit line BL or bit line bar BLB) on the bit line BL[0] and the bit line bar BLB[0] toward a second intermediate voltage level. In some embodiments, the clamping unit (e.g., clamping unit 500 shown in FIG. 5A, clamping unit 502 shown in FIG. 5B, clamping unit 504 shown in FIG. 5C or clamping unit 506 shown in FIG. 5D) ensures the second intermediate voltage level is greater than the threshold voltage $V_{safe}$. In some embodiments, the clamping unit (e.g., clamping unit 500 shown in FIG. 5A, clamping unit 502 shown in FIG. 5B, clamping unit 504 shown in FIG. 5C or clamping unit 506 shown in FIG. 5D) is activate between a read operation (or a dummy read operation) and a write operation.

In some embodiments, as shown in FIG. 7, since the voltage level on the bit line BL[0] and bit line bar BLB[0] (e.g., bit line or bit line bar signal BL and BLB) are equalized to a third intermediate voltage level after time T7, and the clamping unit (e.g., clamping unit 500 shown in FIG. 5A, clamping unit 502 shown in FIG. 5B, clamping unit 504 shown in FIG. 5C or clamping unit 506 shown in FIG. 5D) pulls the voltage level (e.g., bit line BL or bit line bar BLB) on the bit line BL[0] and the bit line bar BLB[0] toward a second intermediate voltage level, and the second intermediate voltage level is greater than the threshold voltage $V_{safe}$, the bit line BL[0] and the bit line bar BLB[0] do not have to be pre-charged to a logically high voltage level (e.g., voltage level VDD) between a read operation and a write operation, and the SNM of the first memory cell array 102 is not adversely affected.

At time T9, curve 708 (e.g., first clamping control signal CLAMP) begins transitioning from a logically low signal to a logically high signal. At time T9, curve 702 (e.g., clock signal CLK) transitions from a logically high signal to a logically low signal.

After time T9, curve 704a (e.g., word line signal WL) starts transitioning from a logically low signal to a logically high signal.

At time T10, curve 708 (e.g., first clamping control signal CLAMP) finishes transitioning from a logically low signal to a logically high signal. At time T10, curve 702 (e.g., clock signal CLK) finishes transitioning from a logically high signal to a logically low signal.

At time T11, curve 704 (e.g., word line signal WL) finishes transitioning from a logically low signal to a logically high signal. At time T11, curve 706b (e.g., bit line or bit line bar signal BL or BLB) starts transitioning from a third intermediate voltage level to a logically low signal. In some embodiments, the second bit line control signal BLEQB triggers the equalization of the bit line and the bit line bar signal BL or BLB.

At time T12, curve 704 (e.g., word line signal WL) transitions from a logically high signal to a logically low signal.

After time T12, curve 706b (e.g., bit line or bit line bar signal BL or BLB) starts transitioning to a logically high signal.

At time T13, curve 704 (e.g., word line signal WL) finishes transitioning from a logically high signal to a logically low signal. At time T13, curve 706b (e.g., bit line or bit line bar signal BL or BLB) finishes transitioning to a logically high signal. While the first bit line control signal PCH (as shown in FIGS. 1 and 3) is not shown in FIG. 7, one of ordinary skill in the art would understand that the bit line BL[0] and bit line bar BLB[0] are pre-charged to VDD for the next clock cycle.

As shown in FIG. 7, by utilizing both the first read assist unit 200' of FIG. 2B (to suppress the replicated word line voltage level WL during a dummy read operation) and the bit line control unit 300 of FIG. 3 (to equalize the bit line/bit line bar voltage level prior to a write operation) in the memory cell circuit 100 shown in FIG. 1, the SNM of the memory cell array 102 can be improved. Furthermore, by equalizing the bit line/bit line bar voltage level prior to a write operation in the memory cell circuit 100, the amount of energy to pre-charge the bit line BL/bit line bar BLB is reduced.

Figure 8:
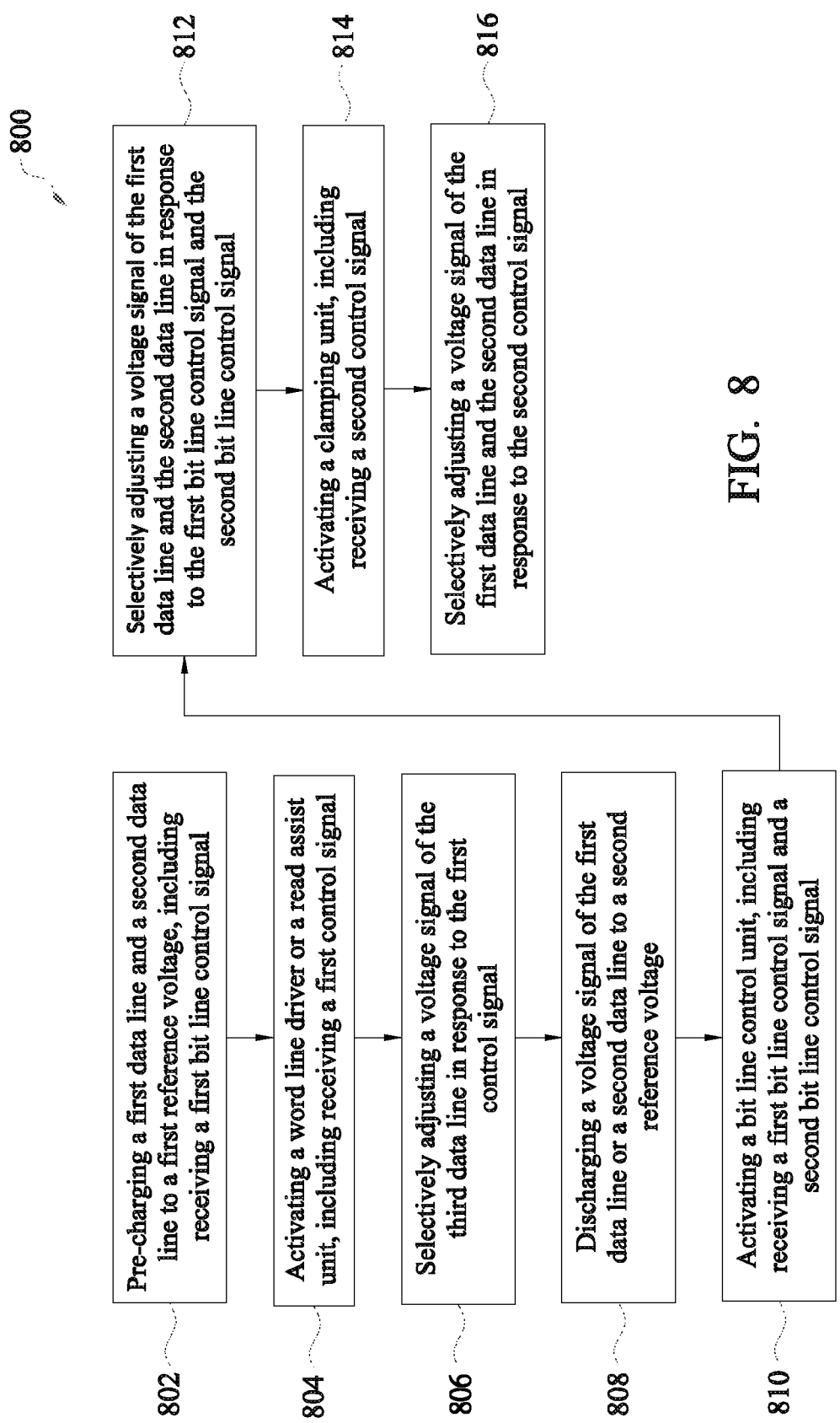
FIG. 8 is a flow chart of a method of controlling an SRAM in accordance with some embodiments.

FIG. 8 is a flow chart of a method 800 of controlling an SRAM in accordance with some embodiments. Method 800 begins with pre-charging a first data line and a second data line in operation 802. Pre-charging a first data line and a second data line comprises setting a voltage level on the first data line and the second data line to a first reference voltage. In some embodiments, the first reference voltage includes a logically high signal. In some embodiments, the first reference voltage includes a logically low signal.

In some embodiments, the first data line includes bit line BL (e.g., bit line BL[0], . . . BL[N−1] shown in FIG. 1). In some embodiments, the second data line includes bit line bar BLB (e.g., bit line bar BLB[0], . . . BLB[N−1] shown in FIG. 1).

In some embodiments, the first bit line control signal includes first bit line control signal (e.g., first bit line control signal PCH shown in FIGS. 1, 3, 4A-4B and 7).

Method 800 continues with operation 804 in which a word line driver or a read assist unit are activated. In some embodiments, the read assist unit is first read assist unit 106[0], . . . 106[M−1] (shown in FIG. 1). In some embodiments, the read assist unit is first read assist unit 200 (shown in FIG. 2A). In some embodiments, the read assist unit is second read assist unit 108 (shown in FIG. 1). In some embodiments, the read assist unit is second read assist unit 200' (shown in FIG. 2B).

In some embodiments, the activating the read assist unit comprises receiving a first control signal. In some embodiments, the first control signal includes first voltage control signal RAE[0], . . . RAE[M−1] (shown in FIGS. 1, 2A-2B, 4A-4B and 7) or second voltage control signal RAE_R1 (shown in FIGS. 1, 2A-2B, 4A-4B and 7).

Method 800 continues with operation 806 in which the read assist unit selectively adjusts a voltage signal of the third data line in response to the first control signal.

In some embodiments, the third data line includes first word line WL (e.g., word line WL[0], . . . WL[M−1] shown in FIG. 1 or second word line WL_R shown in FIG. 1).

Method 800 continues with operation 808 in which a voltage signal of the first data line or a second data line is discharged to a second reference voltage.

In some embodiments, the voltage signal of the first data line includes bit line BL (e.g., curves 406a, 406b shown in FIG. 4A, curves 418a, 418b shown in FIG. 4B or curves 706a, 706b shown in FIG. 7). In some embodiments, the second data line includes bit line bar BLB (e.g., curves 406a, 406b shown in FIG. 4A, curves 418a, 418b shown in FIG. 4B or curves 706a, 706b shown in FIG. 7). In some embodiments, the second reference voltage includes a logically low signal. In some embodiments, the second reference voltage includes a logically high signal.

Method 800 continues with operation 810 in which a bit line control unit is activated. In some embodiments, the bit line control unit is bit line control unit 112[0], . . . 112[N−1] (shown in FIG. 1). In some embodiments, the bit line control unit is bit line control unit 300 (shown in FIG. 3).

In some embodiments, the activating the bit line control unit comprises receiving a first bit line control signal or a second bit line control signal. In some embodiments, the first bit line control signal includes first bit line control signal PCH (shown in FIGS. 1, 4A-4B and 7). In some embodiments, the second bit line control signal includes second bit line control signal BLEQB (shown in FIGS. 1, 4A-4B and 7).

Method 800 continues with operation 812 in which the bit line control unit selectively adjusts a voltage signal of the first data line and a voltage signal of the second data line in response to the first bit line control and the second bit line control signal.

Method 800 continues with operation 814 in which a clamping unit is activated. In some embodiments, the clamping unit is clamping unit 110[0], . . . 110[N−1] (shown in FIG. 1). In some embodiments, the clamping unit is clamping unit 500 (shown in FIG. 5A), clamping unit 504 (shown in FIG. 5B), clamping unit 506 (shown in FIG. 5C) or clamping unit 508 (shown in FIG. 5D).

In some embodiments, the activating the clamping unit comprises receiving a second control signal. In some embodiments, the second control signal includes first clamping control signal CLAMP (shown in FIGS. 1, 4A-4B and 7).

Method 800 continues with operation 816 in which the clamping unit selectively adjusts a voltage signal of the first data line and a voltage signal of the second data line in response to the second control signal.

In some embodiments, operations are able to be removed or that additional operations are able to be added to method 800 without departing from the scope of this description. In some embodiments, an order of operations in method 800 is able to be adjusted without departing from the scope of this description.

One aspect of this description relates to a static random access memory (SRAM). The SRAM includes a memory cell array, a first data line connected to the memory cell array, and a read assist unit connected to the first data line. The read assist unit is configured to suppress a voltage level of the first data line during a read operation of the memory cell array.

Another aspect of this description relates to a semiconductor device including a static random access memory (SRAM). The SRAM includes a memory cell array, a first data line connected to the memory cell array, a second data line connected to the memory cell array, and a clamping unit connected to the first data line and the second data line. Further, the clamping unit is configured to pull a voltage of the first data line or a voltage of the second data line to a first intermediate level prior to a write operation the memory cell array.

Still another aspect of this description relates to a method of controlling a static random access memory (SRAM). The method includes pre-charging a first data line and a second data line to a first reference voltage, wherein the first data line and the second data line are connected to a memory cell, activating a read assist unit connected to a third data line, wherein the third data line is connected to the memory cell, wherein the activating the read assist unit comprises receiving a first control signal, and selectively adjusting a voltage signal of the third data line in response to the first control signal.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) comprising:
a memory cell array;
a first data line electrically connected to the memory cell array;
a data line driver electrically connected to the first data line; and
a read assist unit electrically connected to the first data line, wherein the read assist unit comprises a read assist unit transistor and is configured to suppress a voltage level of the first data line during a read operation of the memory cell array by a resistance ratio of a resistance of the data line driver and a resistance of the read assist unit transistor.

2. The SRAM of claim 1, wherein the first data line is a word line.

3. The SRAM of claim 1, wherein the first read assist unit comprises:
a first N-type transistor;
a first terminal of the first N-type transistor configured as a first input node to receive a first voltage control signal;
a second terminal of the first N-type transistor coupled to at least the first data line; and
a third terminal of the first N-type transistor coupled to a ground.

4. The SRAM of claim 1, further comprising:
a second data line electrically connected to the memory cell array;
a third data line electrically connected to the memory cell array;
a clamping unit electrically connected to the second data line and the third data line, wherein the clamping unit is configured to pull a voltage of the second data line or a voltage of the third data line to an intermediate level prior to a write operation of the memory cell array.

5. The SRAM of claim 4, wherein the second data line is a bit line, and wherein the third data line is a bit line bar.

6. The SRAM of claim 1, further comprising:
a second data line electrically connected to the memory cell array;
a third data line electrically connected to the memory cell array;
a control unit electrically connected to the second data line and the third data line, wherein the control unit is configured to equalize the voltage of the second data line and a voltage of the third data line to an intermediate level prior to a write operation of the memory cell array.

7. The SRAM of claim 6, wherein the second data line is a bit line, and wherein the third data line is a bit line bar.

8. A semiconductor device comprising:
a static random access memory (SRAM) comprising:
a memory cell array;
a first data line electrically connected to the memory cell array;
a second data line electrically connected to the memory cell array; and
a clamping unit electrically connected to the first data line and the second data line, wherein the clamping unit is configured to pull a voltage of the first data line or a voltage of the second data line to an intermediate voltage level after completion of a read cycle and prior to a write operation of the memory cell array, wherein the intermediate voltage level is either:

greater than the voltage of the first data line and less than the voltage of the second data line, or less than the voltage of the first data line and greater than the voltage of the second data line.

9. The semiconductor device of claim 8, wherein the first data line is a bit line, and wherein the second data line is a bit line bar.

10. The semiconductor device of claim 8, wherein the clamping unit comprises:
a first P-type transistor;
a first terminal of the first P-type transistor configured as a first input node to receive a first control signal;
a second terminal of the first P-type transistor coupled to the first data line or the second data line; and
a third terminal of the first P-type transistor coupled to at least a source voltage.

11. The semiconductor device of claim 8, further comprising a control unit electrically connected to the first data line and the second data line, wherein the control unit is configured to equalize voltage levels of the first and second data lines prior to a write operation of the memory cell array.

12. The semiconductor device of claim 10, wherein the first data line is a bit line, and wherein the second data line is a bit line bar.

13. The semiconductor device of claim 11, wherein the control unit comprises:
a first P-type transistor;
a first terminal of the first P-type transistor configured as a first input node to receive a first bit line control signal;
a second terminal of the first P-type transistor coupled to the first data line or the second data line; and
a third terminal of the first P-type transistor coupled to at least a source voltage.

14. The semiconductor device of claim 13, wherein the control unit further comprises:
a second P-type transistor;
a first terminal of the second P-type transistor configured as a second input node to receive a second bit line control signal;
a second terminal of the second P-type transistor coupled to the first data line; and
a third terminal of the second P-type transistor coupled to the second data line.

15. The semiconductor device of claim 8, further comprising:
a third data line electrically connected to the memory cell array; and a read assist unit electrically connected to the third data line, wherein the read assist unit is configured to suppress a voltage level of the third data line during a read operation of the memory cell array.

16. The semiconductor device of claim 15, wherein the third data line is a word line.

17. A method of controlling a static random access memory (SRAM), the method comprising:
pre-charging a first data line and a second data line to a first reference voltage, wherein the first data line and the second data line are electrically connected to a memory cell;
activating a read assist unit electrically connected to a third data line, wherein the third data line is electrically connected to the memory cell, wherein the activating the read assist unit comprises receiving a first control signal; and
selectively adjusting a voltage signal of the third data line to a voltage level that is greater than a logic low voltage level and less than a logic high voltage level in response to the first control signal.

18. The method of claim 17, further comprising:
discharging a voltage signal of the first data line or a voltage signal of the second data line to a second reference voltage;
activating a clamping unit electrically connected to the first data line and the second data line, wherein the activating the clamping unit comprises receiving a second control signal; and
selectively adjusting the voltage signal of the first data line and the voltage signal of the second data line in response to the second control signal.

19. The method of claim 17, further comprising:
discharging a voltage signal of the first data line or a voltage signal of the second data line to a second reference voltage;
activating a bit line control unit electrically connected to the first data line and the second data line, wherein the activating the bit line control unit comprises receiving a first bit line control signal or a second bit line control signal; and
selectively adjusting the voltage signal of the first data line and the voltage signal of the second data line in response to the second bit line control signal.

20. The method of claim 17, wherein the pre-charging the first data line and the second data line comprises receiving a first bit line control signal.

* * * * *